United States Patent
Sadjadi et al.

(10) Patent No.: US 7,465,525 B2
(45) Date of Patent: Dec. 16, 2008

(54) RETICLE ALIGNMENT AND OVERLAY FOR MULTIPLE RETICLE PROCESS

(75) Inventors: S. M. Reza Sadjadi, Saratoga, CA (US); Nicolas Bright, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 640 days.

(21) Appl. No.: 11/126,466

(22) Filed: May 10, 2005

(65) Prior Publication Data

US 2006/0257750 A1 Nov. 16, 2006

(51) Int. Cl.
*G03F 9/00* (2006.01)

(52) U.S. Cl. .............................. 430/5; 430/22; 430/30; 716/19; 716/20; 716/21

(58) Field of Classification Search ..................... 430/5, 430/22, 30; 716/19, 20, 21
See application file for complete search history.

(56) References Cited

U.S. PATENT DOCUMENTS

| | | | |
|---|---|---|---|
| 4,707,218 A | 11/1987 | Giammarco et al. | |
| 4,801,350 A | 1/1989 | Mattox et al. | |
| 4,838,991 A | 6/1989 | Cote et al. | |
| 4,857,477 A | 8/1989 | Kanamori | |
| 5,459,099 A | 10/1995 | Hsu | |
| 5,553,274 A | 9/1996 | Liebmann | |
| 5,654,238 A | 8/1997 | Cronin et al. | |
| 5,874,359 A | 2/1999 | Liaw et al. | |
| 5,895,740 A | 4/1999 | Chien et al. | |
| 5,981,148 A | 11/1999 | Brown et al. | |
| 6,183,937 B1 | 2/2001 | Tsai et al. | |
| 6,189,136 B1 | 2/2001 | Bothra et al. | |
| 6,416,933 B1 | 7/2002 | Singh et al. | |
| 6,528,238 B1 | 3/2003 | Seniuk et al. | |
| 6,528,372 B2 | 3/2003 | Lukanc et al. | |
| 6,579,651 B2 | 6/2003 | Subramanian et al. | |
| 6,589,713 B1 | 7/2003 | Okoranyanwu | |
| 6,610,607 B1 | 8/2003 | Armbrust et al. | |
| 6,665,856 B1 | 12/2003 | Pierrat et al. | |
| 6,844,118 B2 | 1/2005 | Stanton | |
| 6,955,961 B1 | 10/2005 | Chung | |
| 6,968,532 B2 * | 11/2005 | Sivakumar et al. | 716/21 |
| 7,033,948 B2 | 4/2006 | Chung et al. | |
| 7,039,896 B2 | 5/2006 | Medvedeva et al. | |
| 7,271,107 B2 | 9/2007 | Marks et al. | |
| 7,271,108 B2 | 9/2007 | Sadjadi et al. | |
| 2002/0071997 A1 | 6/2002 | Ahrens et al. | |
| 2002/0182549 A1 | 12/2002 | Chang et al. | |
| 2002/0188924 A1 | 12/2002 | Pierrat et al. | |
| 2003/0073298 A1 | 4/2003 | Gonzalez et al. | |
| 2003/0232509 A1 | 12/2003 | Chung et al. | |
| 2004/0048170 A1 | 3/2004 | Pierrat et al. | |
| 2004/0180267 A1 | 9/2004 | Tejnil | |
| 2004/0229135 A1 | 11/2004 | Wang et al. | |
| 2005/0048785 A1 | 3/2005 | Kang et al. | |
| 2005/0070111 A1 | 3/2005 | Kushibiki et al. | |
| 2005/0081178 A1 | 4/2005 | Sivakumar et al. | |
| 2006/0011575 A1 | 1/2006 | Chung et al. | |

FOREIGN PATENT DOCUMENTS

| | | |
|---|---|---|
| DE | 10223249 A1 | 12/2003 |
| EP | JP05088375 | 4/1993 |

OTHER PUBLICATIONS

Office Action dated May 2, 2006, U.S. Appl. No. 11/050,985.
Office Action dated May 3, 2006, U.S. Appl. No. 11/170,273.
U.S. Appl. No. 11/050,985, entitled "Reduction of Feature Critical Dimensions Using Multiple Masks", by inventors Marks et al., filed Feb. 3, 2005.
U.S. Appl. No. 11/126,708, entitled "Computer Readable Mask Shrink Control Processor", by inventors Sadjadi et al., filed May 10, 2005.
U.S. Appl. No. 11/170,273, entitled "Multiple Mask Process with Etch Mask Stack", by inventor S.M. Reza Sadjadi, filed Jun. 28, 2005.
International Search Report and Written Opinion, mailed Sep. 6, 2006.
International Search Report and Written Opinion, mailed Jun. 23, 2006.
Notice of Allowance dated Jun. 15, 2007 for related U.S. Appl. No. 11/170,273.
Notice of Allowance dated Jun. 15, 2007 for related U.S. Appl. No. 11/050,985.
Office Action dated Aug. 17, 2007 for related U.S. Appl. No. 11/126,708.
Office Action dated Jan. 2, 2008 for related U.S. Appl. No. 11/126,708.
International Search Report and Written Opinion, mailed Nov. 10, 2006.

* cited by examiner

*Primary Examiner*—Christopher G Young
(74) *Attorney, Agent, or Firm*—Beyer Law Group LLP

(57) ABSTRACT

A method for generating a plurality of reticle layouts is provided. A feature layout with a feature layout pitch is received. A plurality of reticle layouts is generated from the feature layout where each reticle layout of the plurality of reticle layouts has a reticle layout pitch and where each reticle layout pitch is at least twice the feature layout pitch.

17 Claims, 20 Drawing Sheets

RETICLE ALIGNMENT AND OVERLAY FOR MULTIPLE RETICLE PROCESS

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. Deep ultra violet (DUV) photoresist is exposed by 248 nm light. To facilitate understanding, FIG. 1A is a schematic cross-sectional view of a layer 108 over a substrate 104, with a patterned photoresist layer 112, over an ARL (Anti-reflective layer) 110 over the layer 108 to be etched forming a stack 100. The photoresist pattern has a critical dimension (CD), which may be the width 116 of the smallest feature. Due to optical properties dependent on wavelength, photoresist exposed by longer wavelength light has larger theoretical minimal critical dimensions.

A feature 120 may then be etched through the photoresist pattern, as shown in FIG. 1B. Ideally, the CD of the feature (the width of the feature) is equal to the CD 116 of the feature in the photoresist 112. In practice, the CD of the feature 116 may be larger than the CD of the photoresist 112 due to faceting, erosion of the photoresist, or undercutting. The feature may also be tapered, where the CD of the feature is at least as great as the CD of the photoresist, but where the feature tapers to have a smaller width near the feature bottom. Such tapering may provide unreliable features.

In order to provide features with smaller CD, features formed using shorter wavelength light are being pursued. 193 nm photoresist is exposed by 193 nm light. Using phase shift reticles and other technology, a 90-100 nm CD photoresist pattern may be formed, using 193 nm photoresist. This would be able to provide a feature with a CD of 90-100 nm. 157 nm photoresist is exposed by 157 nm light. Using phase shift reticles and other technology sub 90 nm CD photoresist patterns may be formed. This would be able to provide a feature with a sub 90 nm CD.

The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist and 157 nm photoresist may not have selectivities as high as longer wavelength photoresists and may deform more easily under plasma etch conditions.

In the etching of conductive layers, such as in the formation of memory devices, it is desirable to increase device density without diminishing performance.

FIG. 2A is a cross-sectional view of a patterned photoresist layer for producing conductive lines, when spacing between the lines is too close according to the prior art. Over a substrate 204, such as a wafer a barrier layer 206 may be placed. Over the barrier layer 206 a dielectric layer 208 such as a metal layer or a polysilicon layer is formed. Over the dielectric layer 208 an antireflective layer (ARL) 210 such as a DARC layer is formed. A patterned photoresist layer 212a is formed over the ARL 210. In this example the patterned photoresist lines 214a have a width defined as the line width "L", as shown. The spaces 222 have a width "S", as shown. The pitch length "P" is defined as the sum of the line width and the space width P=L+S, as shown. It is desirable to reduce the pitch length.

One way of reducing pitch with is by reducing space width. FIG. 2B is a cross-sectional view of a patterned photoresist layer for producing conductive or dielectric trench lines, when spacing between the lines is too close according to the prior art. Over a substrate 204, such as a wafer a barrier layer 206 may be placed. Over the barrier layer 206 a conductive or dielectric layer 208 such as a metal layer, a polysilicon layer, or a dielectric layer is formed. Over the layer 208 an antireflective layer (ARL) 210 such as a DARC layer is formed. A patterned photoresist layer 212 is formed over the ARL 210. In this example, the patterned photoresist layer 212b forms patterned lines 214b with photoresist residue 218 formed in spaces between the patterned lines 214b. The presence of the photoresist residue 218 is caused by providing too small of a space between the patterned lines 214b, since it is more difficult to remove residue from a small space. This may limit the density of the conductive lines that may be provided.

SUMMARY OF THE INVENTION

To achieve the foregoing and in accordance with the purpose of the present invention a method for generating a plurality of reticle layouts is provided. A feature layout with a feature layout pitch is received. A plurality of reticle layouts is generated from the feature layout where each reticle layout of the plurality of reticle layouts has a reticle layout pitch and where each reticle layout pitch is at least twice the feature layout pitch.

In another manifestation of the invention, an apparatus comprising computer readable media is provided. The computer readable media comprises computer readable code for receiving a feature layout with a feature layout pitch and computer readable code for generating a plurality of reticle layouts from the feature layout, where each reticle layout of the plurality of reticle layouts has a reticle layout pitch and where each reticle layout pitch is at least twice the feature layout pitch.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The invention provides features with small critical dimensions (CD). More specifically, the invention provides features with CD's that are less than the CD of the photoresist pattern used to etch the feature.

Figure 1A:
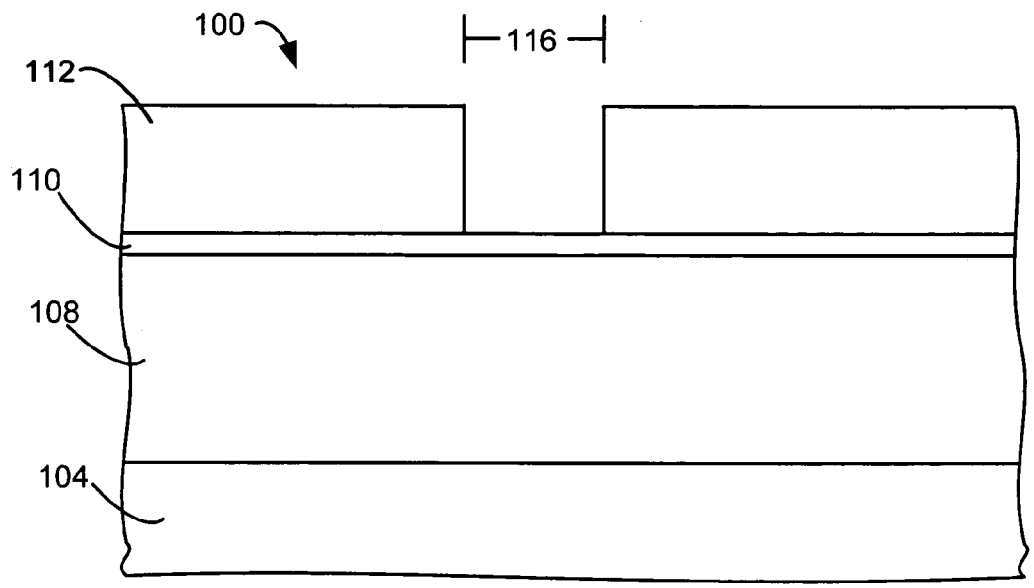
FIGS. 1A-B are schematic cross-sectional views of a stack etched according to the prior art.
Figure 1B:
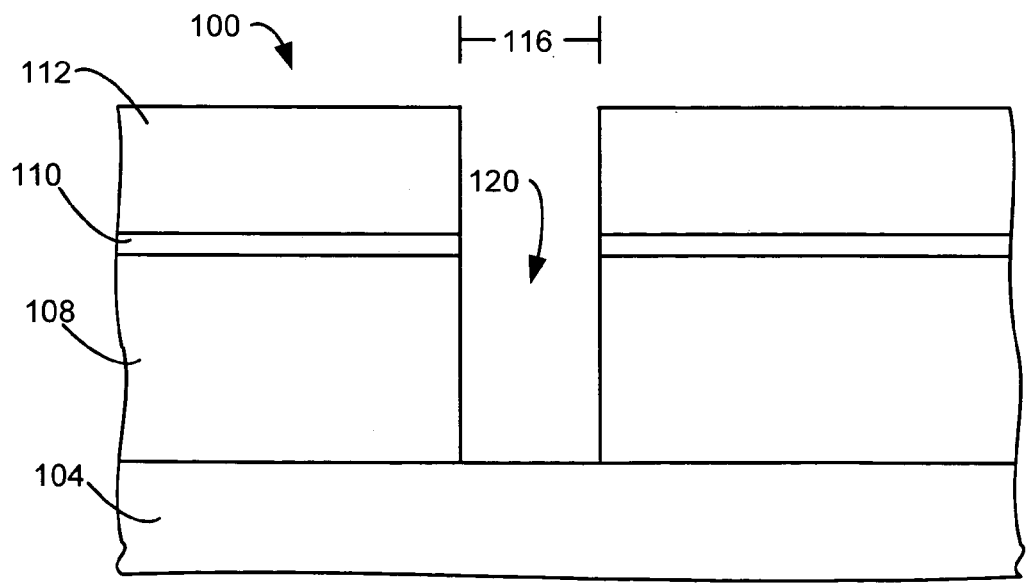
Figure 2:
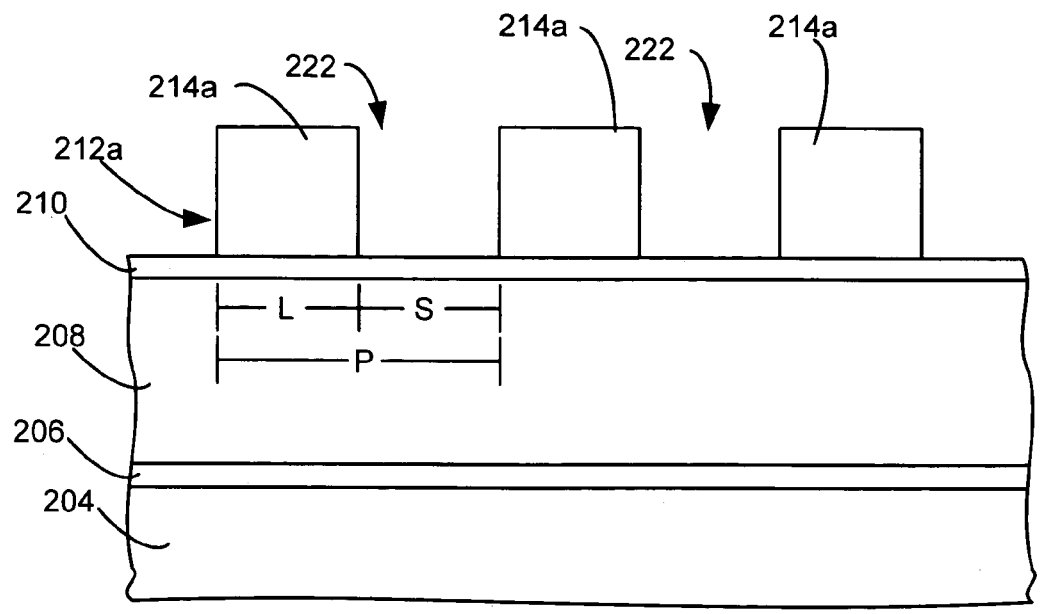
FIGS. 2A-B are schematic cross-sectional views of patterned photoresist layers formed according to the prior art.
Figure 2:
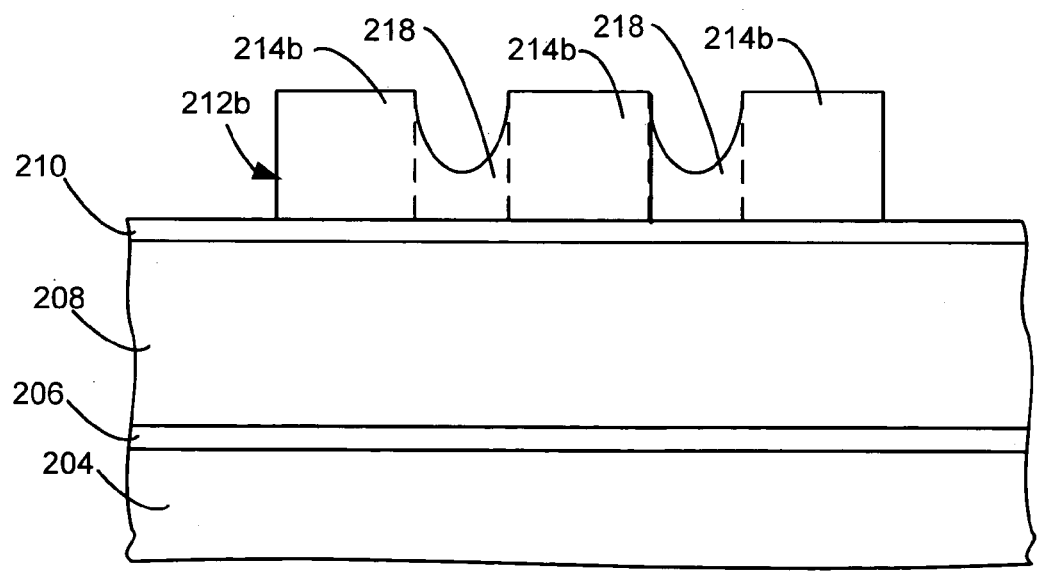
Figure 3:
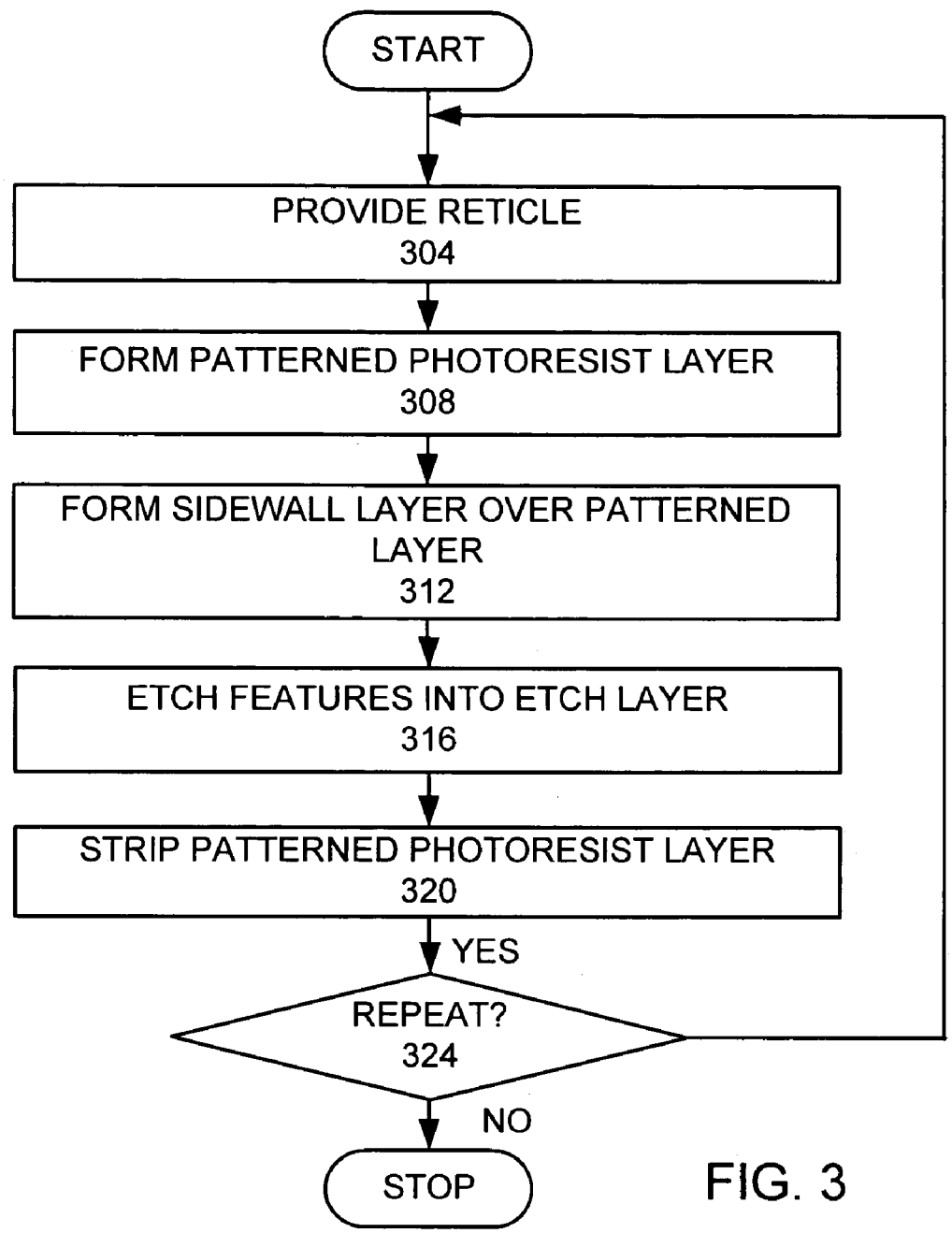
FIG. 3 is a high level flow chart of a process that may be used in an embodiment of the invention.
Figure 4:
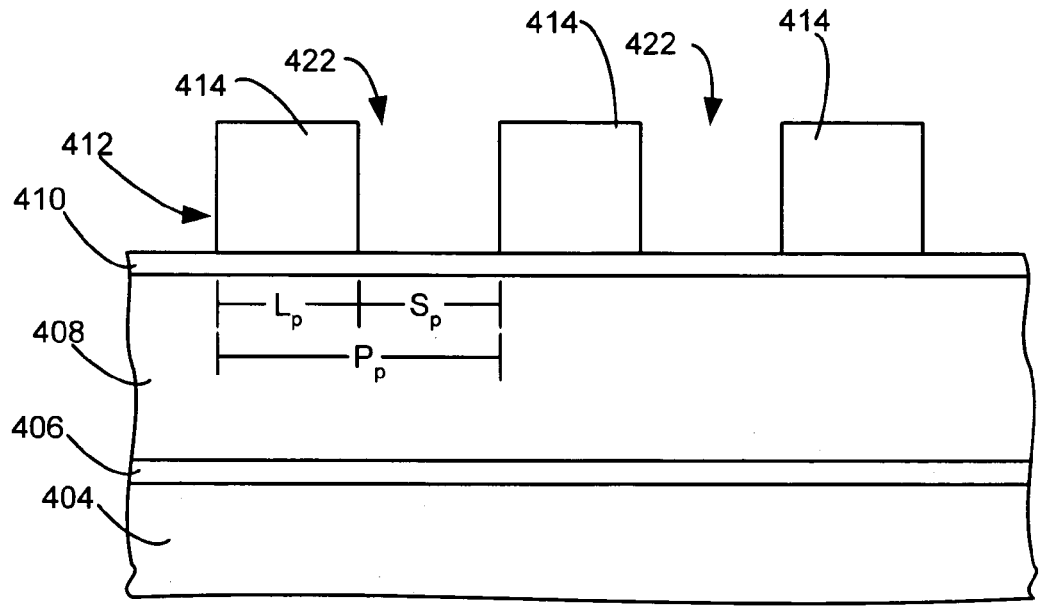
FIGS. 4A-H are schematic cross-sectional views of a stack processed according to an embodiment of the invention.
Figure 4:
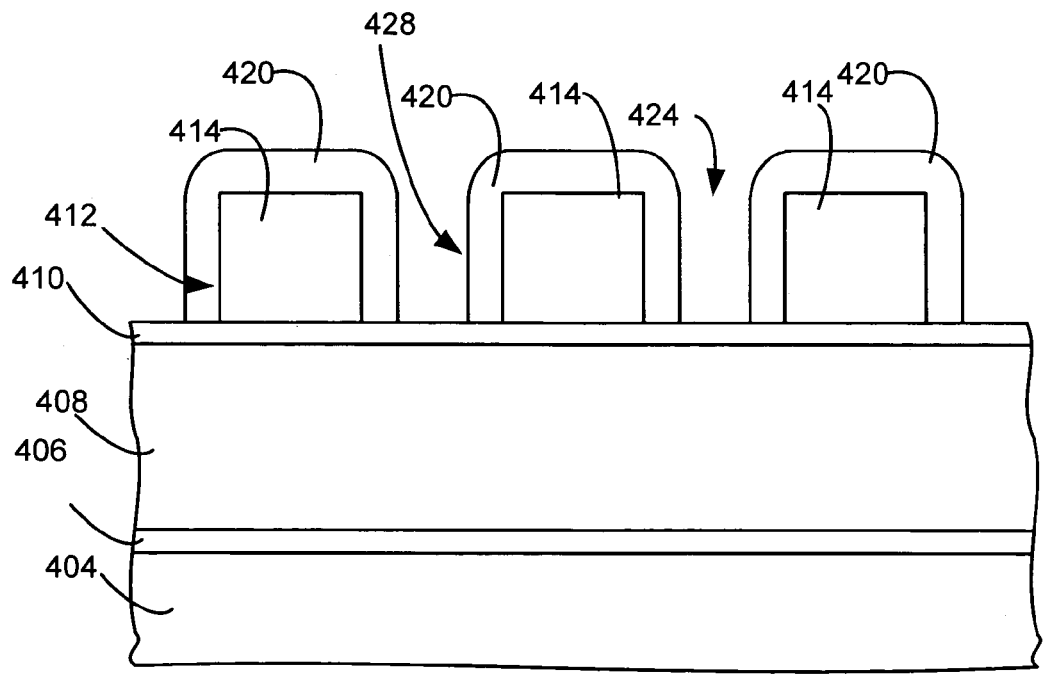
Figure 4:
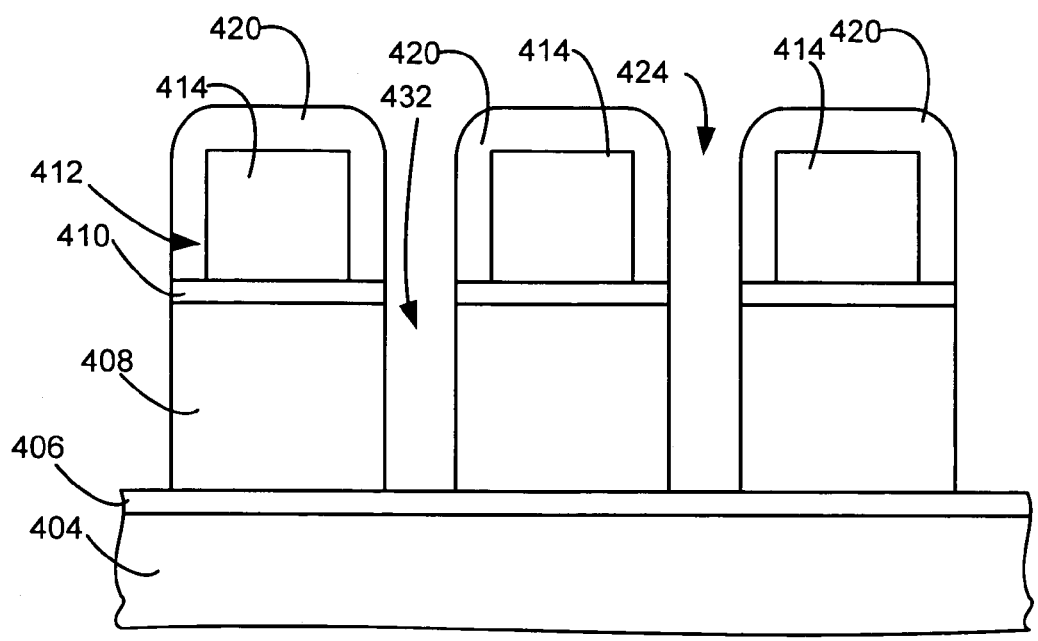
Figure 4:
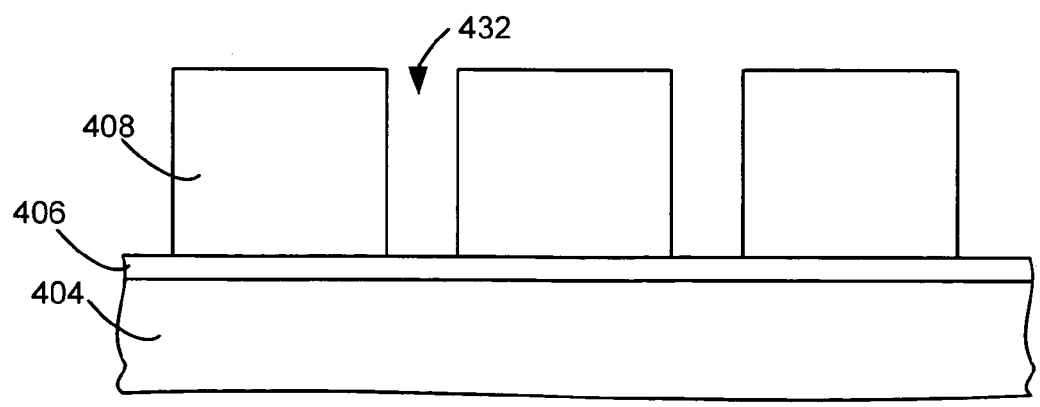
Figure 4:
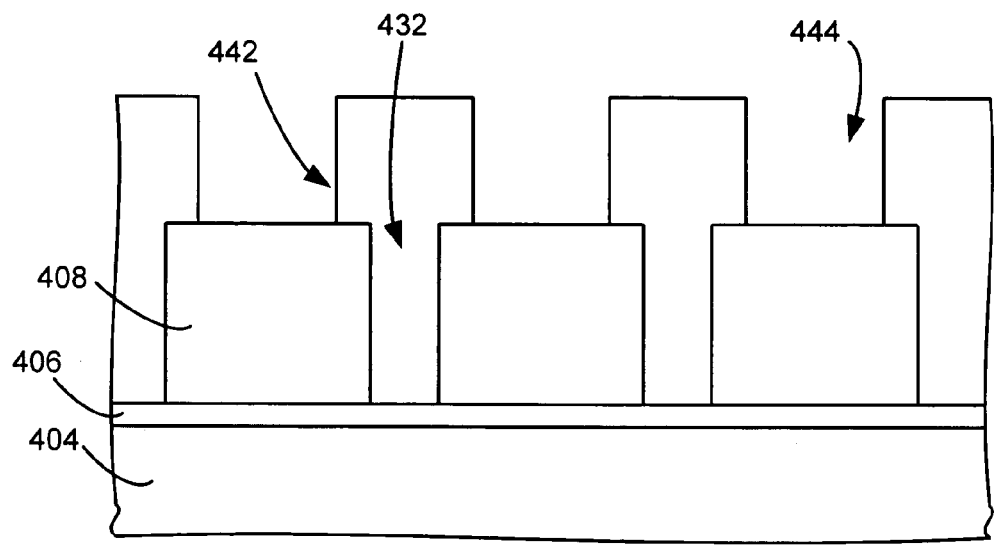
Figure 4:
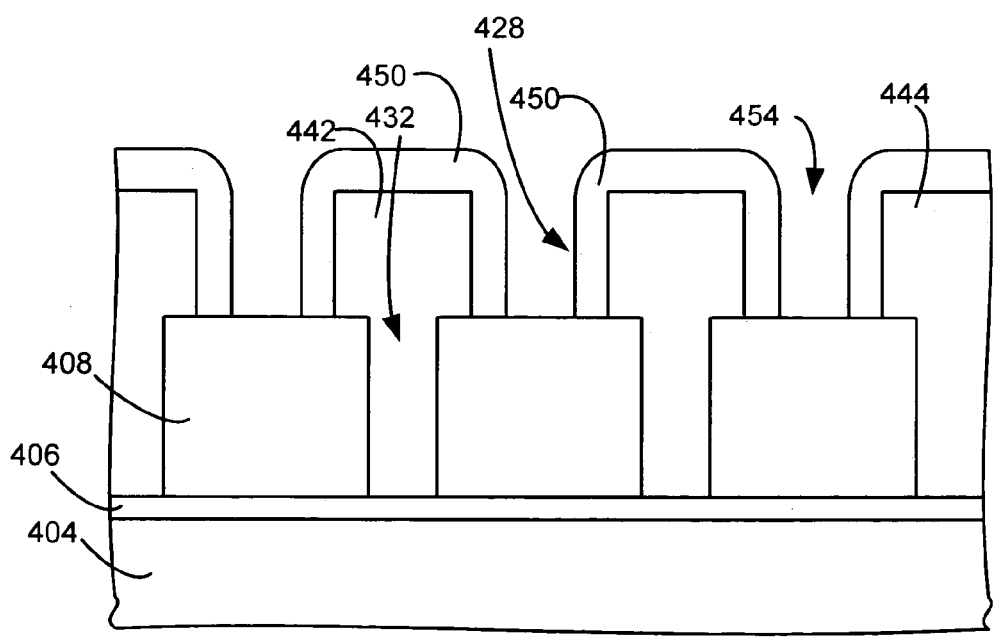
Figure 4:
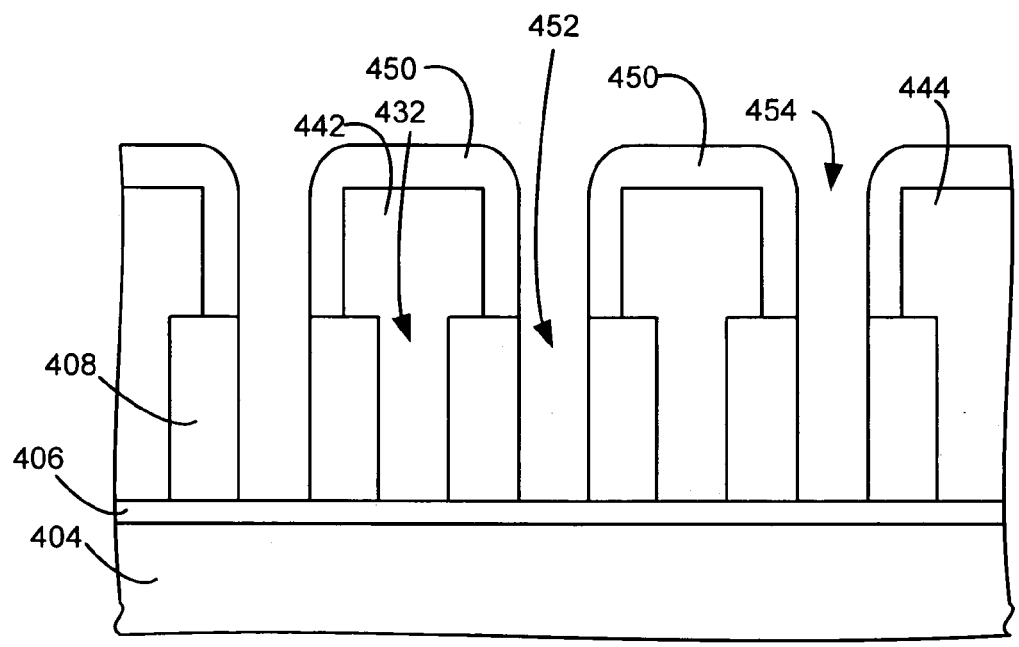
Figure 4:
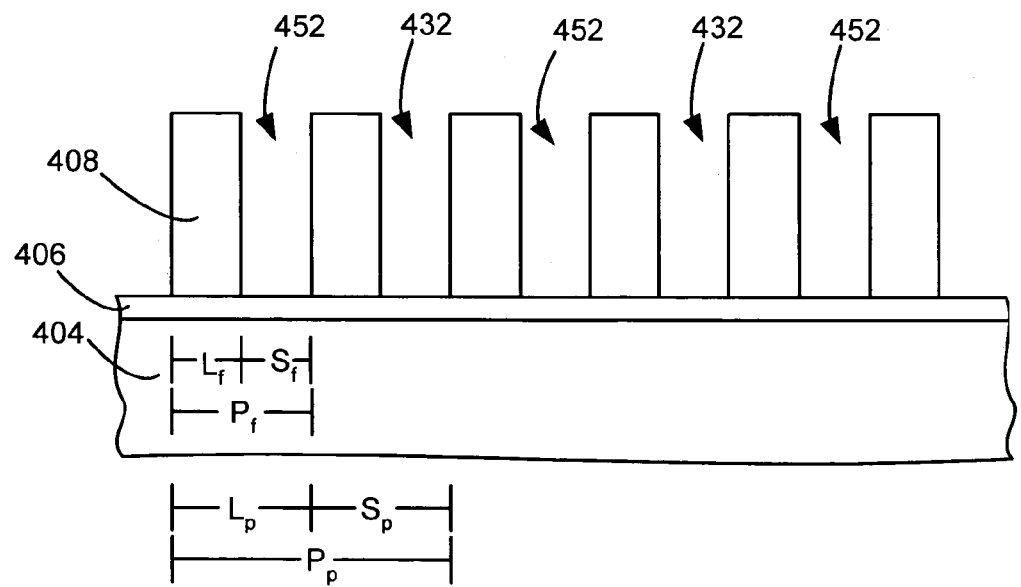

To facilitate understanding, FIG. 3 is a high level flow chart of a process that may be used in an embodiment of the invention. A reticle is provided (step 304). This step will be described in more detail below. A patterned photoresist layer is then formed (step 308). This step will also be described in more detail below. FIG. 4A is a cross-sectional view of a patterned photoresist layer in an embodiment of the invention. Over a substrate 404, such as a wafer a barrier layer 406 may be placed. Over the barrier layer 406 an etch layer 408 such as a conductive metal layer or a polysilicon layer or a dielectric layer is formed. Over the etch layer 408 an antireflective layer (ARL) 410 such as a DARC layer is formed. A first patterned photoresist layer 412 is formed over the ARL 410. In this example the patterned lines 414 have the width defined as the line width "$L_p$", as shown. The spaces 422 in the photoresist layer have a width "$S_p$", as shown. The pitch length "$P_p$" of the patterned photoresist layer is defined as the sum of the line width and the space width $P_p = L_p + S_p$, as shown. These widths are determined by the resolution of the lithographic techniques used to form the patterned photoresist layer. It is desirable to reduce the pitch length.

Figure 5:
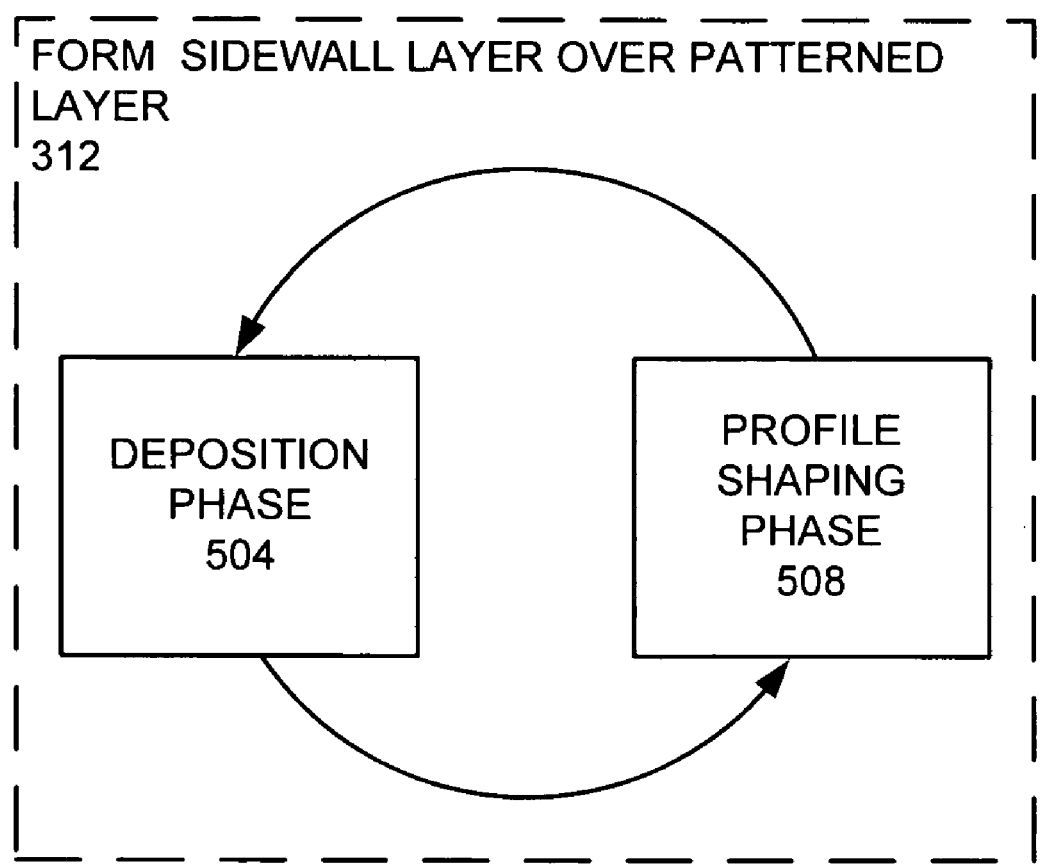
FIG. 5 is a flow chart of forming a sidewall layer over a patterned photoresist layer.

A sidewall layer is formed over the patterned photoresist layer to reduce the CD (step 312). FIG. 5 is a more detailed flow chart of the forming a sidewall layer over the patterned photoresist layer to reduce CD (step 312), which uses gas modulation. In this embodiment, the forming the sidewall layer over the patterned photoresist layer to reduce CD (step 312) comprises a deposition phase 504 and a profile shaping phase 508. The deposition phase uses a first gas chemistry to form a plasma, which deposits a sidewall layer over the sidewalls of the patterned photoresist layer. The profile shaping phase 508 uses a second gas chemistry to form a plasma, which shapes the profile of the deposition to form substantially vertical sidewalls.

FIG. 4B is a schematic cross-sectional view of the patterned first patterned photoresist layer 412 with a sidewall layer 420 deposited over the sidewalls of the first patterned photoresist layer. The sidewall layer 420 forms a sidewall layer feature 424 within the patterned photoresist layer spaces, where the sidewall layer feature 424 has a reduced space CD that is less than the space CD of the first patterned photoresist layer. Preferably, the reduced space CD of the deposited first patterned photoresist layer is 50% less than the space CD of the first patterned photoresist layer feature. It is also desirable that the sidewall layer has substantially vertical sidewalls 428, which are highly conformal as shown. An example of a substantially vertical sidewall is a sidewall that from bottom to top makes an angle of between 88° to 90° with the bottom of the feature. Conformal sidewalls have a deposition layer that has substantially the same thickness from the top to the bottom of the feature. Non-conformal sidewalls may form a faceting or a bread-loafing formation, which provide non-substantially vertical sidewalls. Tapered sidewalls (from the faceting formation) or bread-loafing sidewalls may increase the deposited layer CD and provide a poor etching patterned photoresist layer. Preferably, the deposition on the sidewall is thicker than the deposition on the bottom of the first patterned photoresist layer feature. More preferably, no layer is deposited over the bottom of the first patterned photoresist layer feature.

A first set of features are then etched into the etch layer 408 through the sidewall layer spaces (step 316). FIG. 4C shows a first set of features 432 etched into the etch layer 408. In this example, the first set of features 432 etched in the etch layer 408 has a CD width, which is equal to the space CD of the deposited layer feature. In practice, the CD of the features of the first set of features 432 may be slightly larger than the CD of the feature of the deposited layer 420. However, since the CD of the deposited layer feature is significantly smaller than the CD of the photoresist 412, the CD of the features in the etch layer 408 is still smaller than the CD of the photoresist 412. If the CD of the deposited layer was only slightly smaller than the CD of the photoresist, or if the deposited layer was faceted or bread loafed, then the CD of the layer to be etched might not be smaller than the CD of the photoresist. In addition, a faceted or bread-loafing deposited layer may cause a faceted or irregularly shaped feature in the layer to be etched. It is also desirable to minimize deposition on the bottom of the photoresist feature. In this example, the CD of the features etched in the layer to be etched 408 is about 50% less than the CD of the photoresist feature.

The patterned photoresist layer and deposited layer is then stripped (step 320). This may be done as a single step or two separate steps with a separate deposited layer removal step and photoresist strip step. Ashing may be used for the stripping process. FIG. 4D shows the substrate 400 after the deposited layer and photoresist layer have been removed.

A determination is made on whether additional features are to be etched (step 324). In this example, a second set of etch features are etched. Therefore, a second reticle is provided (step 304). The process of providing the reticle is described in more detail below. A second patterned photoresist layer is formed over the etched features (step 308), which in this case is the first set of etched features. FIG. 4E shows the substrate 404, where a second patterned photoresist layer 442 has been formed over the etch layer 408, wherein the second patterned photoresist layer 442 covers the first set of features 432 and where spaces 444 in the second patterned photoresist layer are formed between the first set of etched features 432.

A sidewall layer is then deposited over the sidewalls of the second patterned photoresist layer features to reduced the CD (step 312). FIG. 4F is a schematic cross-sectional view of the second patterned photoresist layer 442 with a sidewall layer 450 deposited over the sidewalls of the second patterned photoresist layer 442. The sidewall layer 450 forms a sidewall layer feature 454 within the patterned photoresist layer space, where the sidewall layer feature 454 has a reduced space CD that is less than the space CD of the second patterned photoresist layer. Preferably, the reduced space of the sidewall layer feature is 50% less than the space CD of the second patterned photoresist layer feature. It is also desirable that the patterned photoresist layer feature 422 has substantially vertical sidewalls, which are highly conformal as shown. An example of a substantially vertical sidewall is a sidewall that from bottom to top makes an angle of between 88° to 90° with the bottom of the feature. Preferably, the deposition on the side wall is thicker than the deposition on the bottom of the photoresist feature. More preferably, no layer is deposited over the bottom of the photoresist feature.

Features are etched into the etch layer (step 316) forming a second set of etch features 452 between the first set of etch features 432, as shown in FIG. 4G. The patterned photoresist layer and deposited layer are then stripped (step 320), as shown in FIG. 4H. The line width of the etch layer is shown as $L_f$. The space width of the features in the etch layer is shown as $S_f$. The pitch length of the features is shown as $P_f$, where $P_f = L_f + S_f$. For comparison, patterned photoresist layer pitch $P_p$, photoresist line width $L_p$, and photoresist spacing $S_p$ from FIG. 4A, are shown in FIG. 4G for comparison with feature pitch $P_f$, feature line width $L_f$, and feature space width $S_f$. In this embodiment, the length of the pitch for the features $P_f$ is half the length of the pitch of the patterned photoresist layer $P_p$, since the line width between features $L_f$ is half of the line width of the patterned photoresist layer $L_p$ and the feature space width $S_f$ is half of the space in the patterned photoresist layer $S_p$. Therefore, this process is able to use two masking steps to double etch feature resolution, by reducing pitch length, line width, and feature width by half, while using the same photoresist lithography process. In this example the first set of etch features from the first patterned photoresist layer is etched to the same depth or about the same depth as the second set of etch features from the second patterned photoresist layer, as shown.

Since this embodiment uses only two patterned photoresist layers, at the repeat step (step 336), it is determined that the process is not repeated (step 324).

Shrink-Correction Processor

Figure 7:
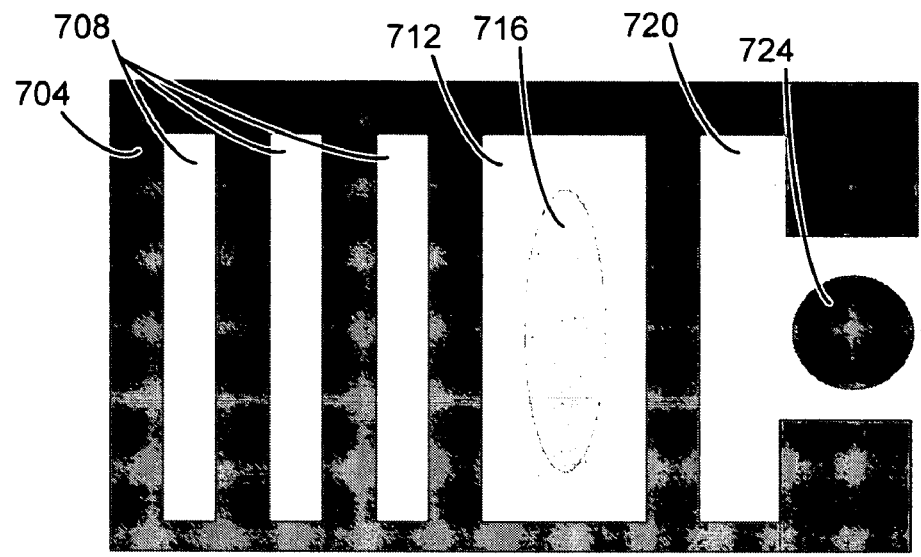
FIG. 7 is a top view of a patterned photoresist layer.
Figure 8:
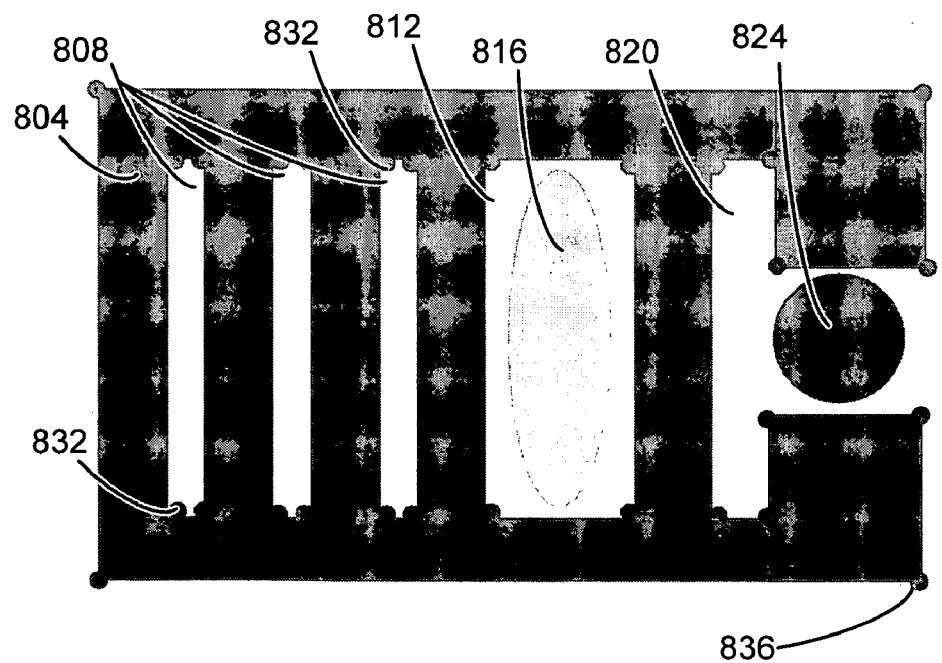
FIG. 8 is a top view of the patterned photoresist layer of FIG. 7 after a sidewall layer is formed over the sidewalls of the patterned photoresist layer.

FIG. 7 is a top view of a patterned photoresist layer 704. The patterned photoresist layer provides three thin rectangular openings 708, a large rectangular opening 712 with an oval shape portion 716, and an open feature 720 with a circular portion 724. FIG. 8 is a top view of the patterned photoresist layer 804 after a sidewall layer is formed over the sidewalls of the patterned photoresist layer 804. It should be noted that the sidewalls do not reduce CD in an even manner to obtain the same features with uniformly smaller dimensions. Instead, as shown in FIG. 8 there are different CD-shrink bias for features of different sizes and shapes depending on the width and the layout of the features. As can be seen in FIG. 8, the lines of different spacing can shrink differently. In addition, the circular portion 824 can maintain the shape of a circle, while the oval shaped portion 816 is enlarged more along the major axis compared to the minor axis. In addition, the corners of lines 808 receive enlargement in both x and y axis directions, so that these corners grow more than the sidewall of the lines, developing rounding protrusions 832. For similar reasons, other corners develop other rounding protrusions 836.

It would be desirable to provide a reticle that provides a patterned photoresist layer that when covered with a sidewall layer produces features with reduced CD to correct for geometry dependencies of the shrink process.

Figure 9:
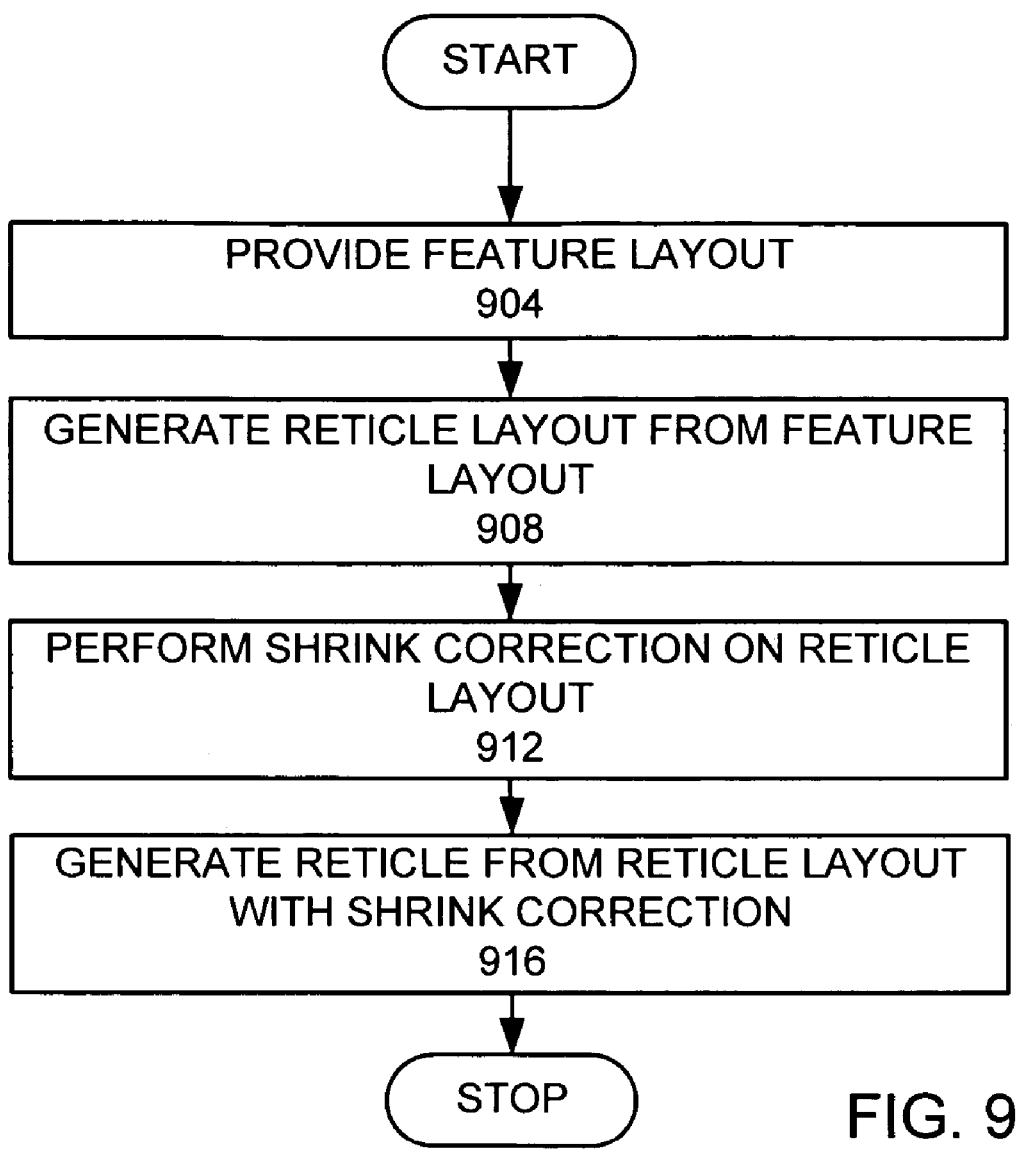
FIG. 9 is a flow chart of a process for providing a reticle.
Figure 10:
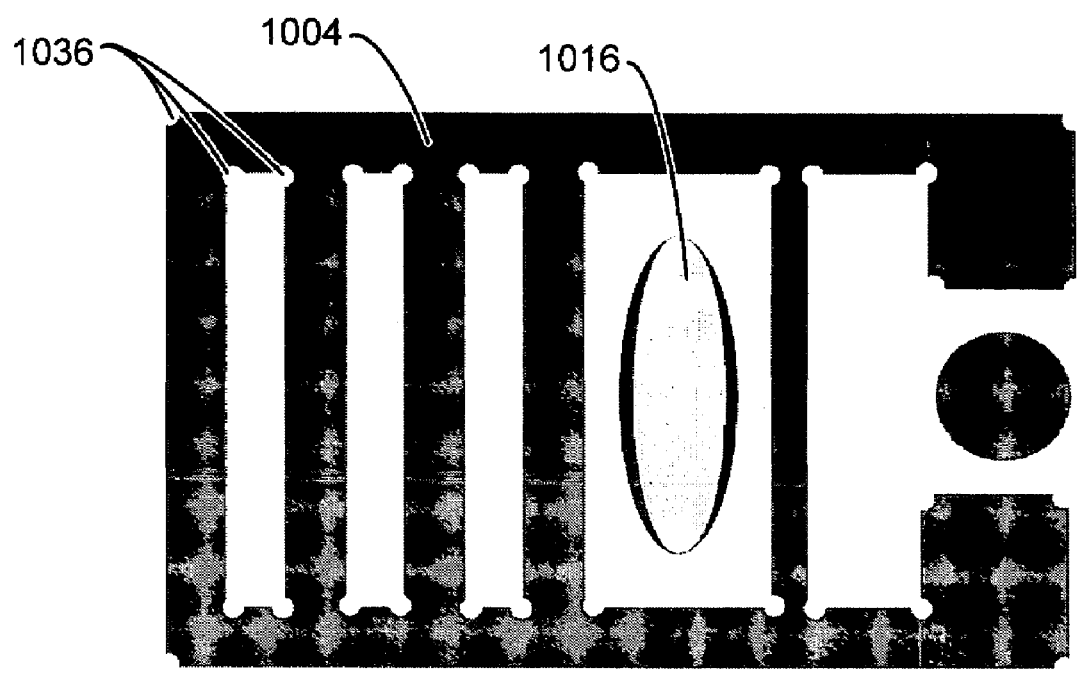
FIG. 10 is a top view of a patterned photoresist layer of FIG. 7 with shrink correction.

FIG. 9 is a flow chart of providing a reticle (step 304). A feature layout is provided (step 904). A reticle layout is generated from the feature layout (step 908). A shrink correction is performed on the reticle layout (step 912). FIG. 10 is a top view of a patterned photoresist layer 1004 that has shrink correction. One shrink correction rule provides an enlarged space 1036 at each corner of the layout. In addition, relative scaling of features are changed. For example, the thickness of the oval shaped portion 1016 is increased, without increasing the length of the oval shaped portion 1016.

Usually in current litho and etch process there is a phenomena that is called line shortening, in which the lithographic process shortens the patterned photoresist lines. Litho rounds the edge of the patterned photoresist line, thus requiring optical proximity correction (OPC) to correct this. Also, during etch the end of the patterned lines are more exposed to sputtering and get shorter. In G-mode, a layer is formed over the patterned lines making the patterned lines bigger and the features between the lines smaller. Hence, shrink correction can be used to compensate for litho line shortening without using OPC. Therefore, the shrink correction may be used to eliminate or minimize OPC and also eliminate the need for features to account for line edge shortening.

A reticle is then generated from the reticle layout with shrink correction (step 916).

Multiple Reticle Generation

In the example above shown in FIG. 4A-F, when at least two etch processes are used requiring at least two separate patterned photoresist layers, reticle and alignment issues need to be addressed. In this example, the reticle for forming the patterned photoresist layer for the first etch may be used for the second etch, if the reticle is shifted (moved) about half the pitch. The alignment of the two patterned photoresist layers (when using the same reticle for $1^{st}$ and $2^{nd}$ exposure) could be a problem, when a conventional a box-in-box alignment scheme is used. For example, after the first mask and shrink, the dimension of the alignment box is reduced by 200 nm, which is the same as what the lines and spaces are shrunk. Now, if the second patterned photoresist layer is shifted 200 nm relative to the original line and space pitch to achieve the half pitch, the alignment of the second patterned photoresist layer actually has to adjusted by 400 nm. Usually, lithography tools are built to align these alignment keys and implementing a misalignment is a change in conventional methodologies and can be source of confusion and potential large yield losses. This problem increases, because the alignment adjustment has to be done in both in X and Y directions.

In addition, for the alignment of the subsequent layer, which is generally a hole (contact or via), further difficulties result, because the alignment key would have two edges, which are the inner edge with is related to the first shrink and a second edge which is due to the second shrink. This can effect and even can be misread by the alignment algorithms, which must align the holes to the lines and spaces. In addition, the double edges can reduce the sensitivity of alignment due to their close proximity of the edges together. The sensitivity issues (fuzzy edges) can get worse for very small CDs, which require small amounts of shrink (in order of a few $10^{th}$ of nm), where the edges would almost can blend with each other and a sharp edge becomes nonexistent.

In addition, applications where a pattern to be created is more complex than a plurality of evenly spaced equal dimension parallel lines, more needs to be done than simply shifting a reticle.

Figure 11:
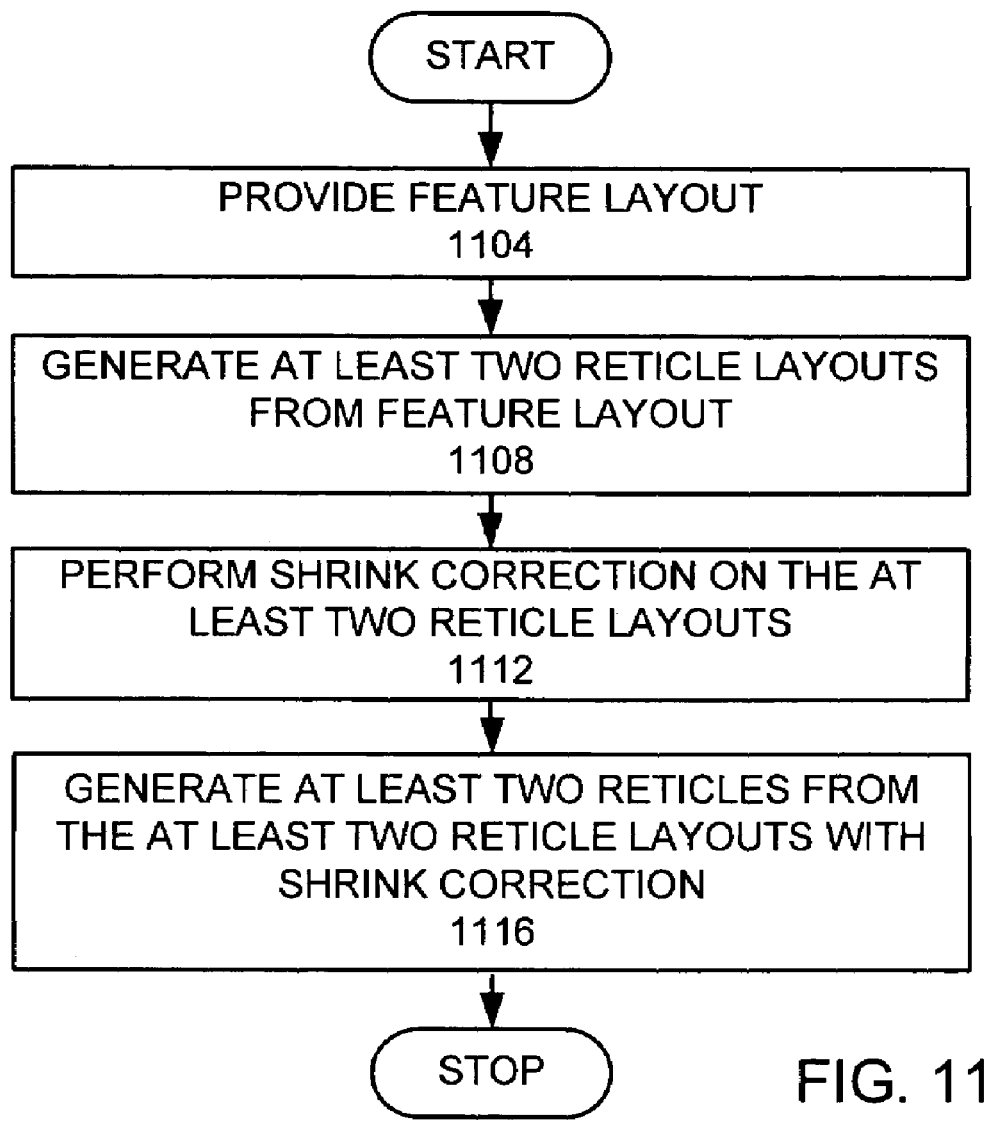
FIG. 11 is a flow chart of another process for providing reticles.

FIG. 11 is a flow chart of providing a reticle (step 304) when more than one etch is used. A feature layout is provided (step 1104). At least two reticle layouts are generated from the feature layout (step 1108). A shrink correction is performed on each of the at least two reticle layouts (step 1112). At least two reticles are generated from the at least two reticle layouts with shrink correction (step 1116).

EXAMPLE

Figure 12:
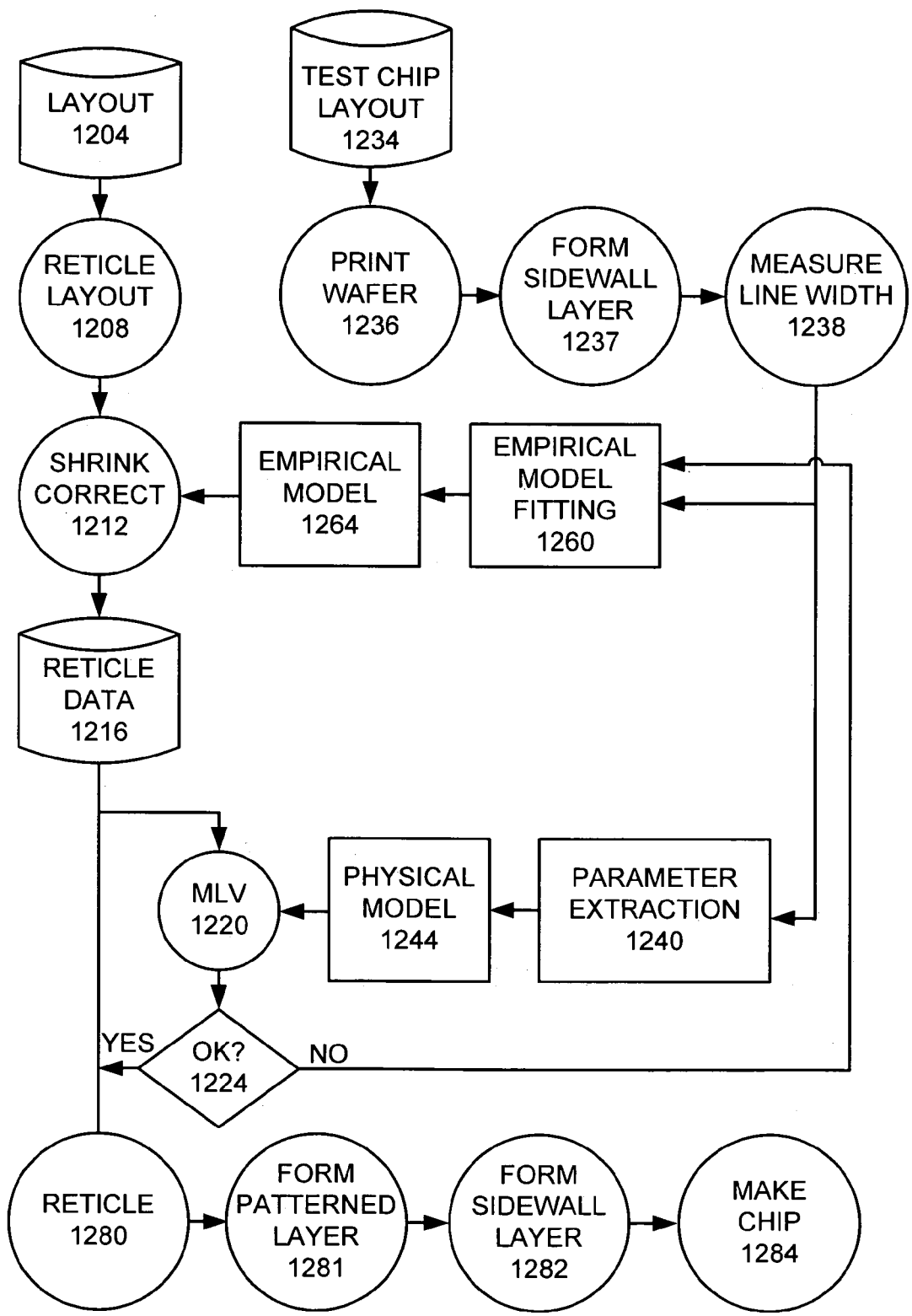
FIG. 12 is a schematic illustration of a system for providing reticles.

An example of a system, which utilizes an embodiment of the invention, a system 1200 as shown in FIG. 12 is used to provide the reticles for a multimask etch process and is used to provide verification for modification of shrink control rules. A feature layout of placement of features is created and/or submitted at layout 1204 (step 1104). A reticle layout 1208 in this embodiment generates at least two reticle layouts from the feature layout (step 1108) for use in a multi-etch process. The reticle layout requires computer code that is able to generate from the feature layout a plurality of reticles and to enlarge the features according to the shrink process to be used.

A shrink correction processor 1212 is used to perform a shrink correction on the at least two reticle layouts (step 1112). The shrink correction processor 1212 is used to create reticle data 1216 for at least two reticle layouts with shrink correction (step 1116). The remaining elements in this example system 1200 are used to perform the remaining steps of FIG. 3 and to perform a verification process to provide additional rules for the shrink correction processor 1212.

To help generate additional shrink correction rules for the shrink correction processor, either a test chip layout may be created or the reticle data 1216 may be used to create a test chip layout 1234. The test chip layout is printed on a wafer 1236 to form a patterned photoresist layer on the test chip. A layer is formed 1237 over the patterned photoresist layer to perform a sidewall layer over the patterned photoresist layer. A line width measurement is then made 1238. In one embodiment, the line width measurement may be of the patterned photoresist layer pattern with the sidewall layer. In another embodiment, an etch is performed and the measurement is done on the etched features. These measurements are provided as input to an empirical model fitting engine 1260 and a parameter extraction engine 1240. The output of the empirical model fitting engine is used to generate an empirical model 1264, which is used to provide improved rules to the shrink correction processor 1212.

In addition, a physical model is made using parameter extraction 1240 to extract process parameters from the same data set used for empirical model fitting to create a physical model 1244. A mask layout verification (MLV) 1220 compares the reticle data 1216 with the physical model 1244. If the comparison is not sufficiently close 1224 then the data is provided to the empirical model fitting engine 1260. The output of the empirical model fitting engine is used to generate an empirical model 1264, which is used to provide improved rules to the shrink correction processor 1212. The shrink correction processor 1212 then provides new reticle data 1216. If the comparison is sufficiently close 1224, then the reticle data may be used to make a reticle 1280 (step 304). The reticle is used to form a patterned photoresist layer 1281 (step 308). A sidewall layer is formed on the patterned photoresist layer 1282 (step 312). Features are etched into the etch layer through the patterned photoresist layer (step 316) to make a chip 1284.

Various other processes may be used to apply the feature layout to generate multiple reticles and to apply the shrink correction to a reticle layout. For example a shrink correction may be performed and provide a list of shrink correction features and their characteristics to a user. The user would then enter guidelines for the correction. In another embodiment, data reticle tapes may be first made. Shrink correction would then be applied to the data on the data reticle tapes, which would provide a list of features and characteristics to a user. The user would then enter guidelines for the corrections. The corrections would then be provided in a file. These processes instead may be replaced by a more automated method. In another variation, the guidelines for corrections are pre-programmed and the SCPP would automatically apply them to the layout and the reticle files.

Figure 6A:
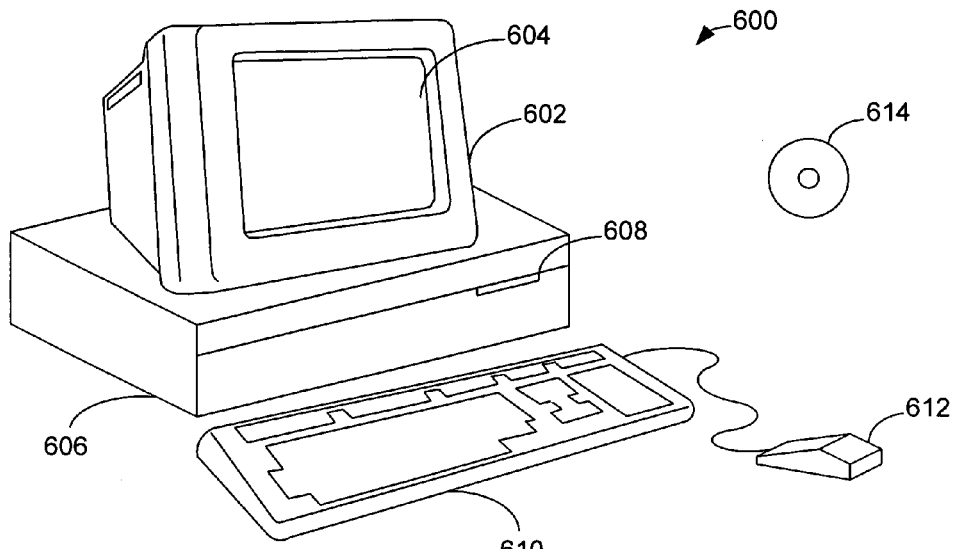
FIGS. 6A-B illustrate a computer system, which is suitable for implementing a controller used in embodiments of the present invention.
Figure 6B:
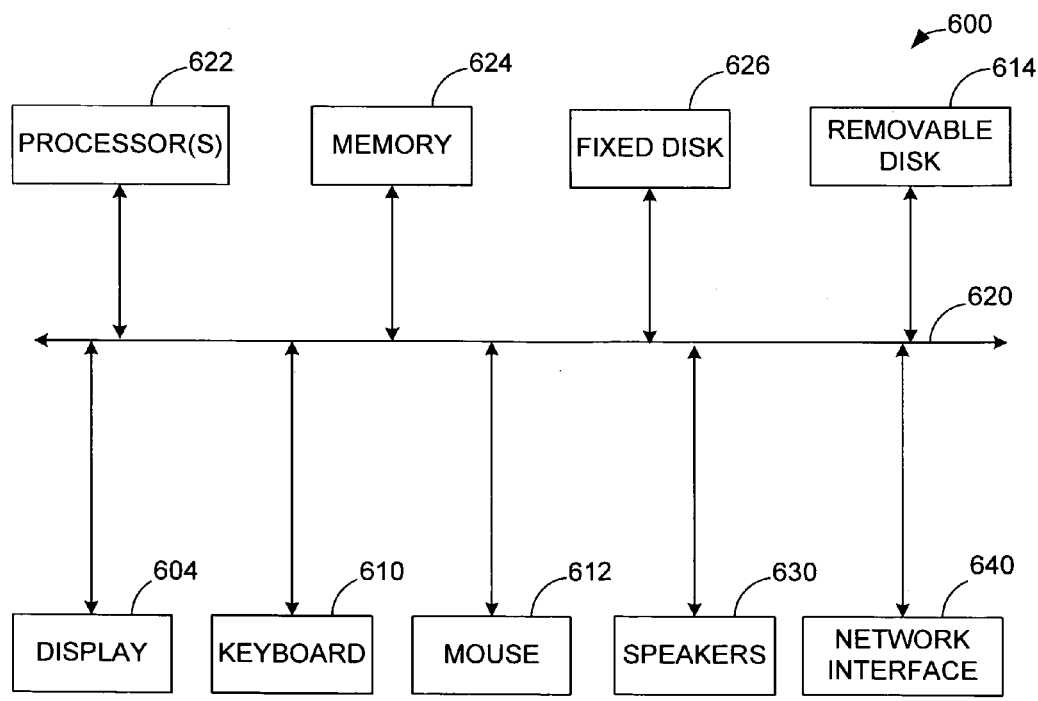

FIGS. 6A and 6B illustrate a computer system 600, which is suitable for receiving the feature layout, generating the reticles and performing the shrink correction used in embodiments of the present invention. FIG. 6A shows one possible physical form of the computer system. Of course, the computer system may have many physical forms ranging from an integrated circuit, a printed circuit board, and a small hand-held device up to a huge super computer. Computer system 600 includes a monitor 602, a display 604, a housing 606, a disk drive 608, a keyboard 610, and a mouse 612. Disk 614 is a computer-readable medium used to transfer data to and from computer system 600.

FIG. 6B is an example of a block diagram for computer system 600. Attached to system bus 620 is a wide variety of subsystems. Processor(s) 622 (also referred to as central processing units, or CPUs) are coupled to storage devices, including memory 624. Memory 624 includes random access memory (RAM) and read-only memory (ROM). As is well known in the art, ROM acts to transfer data and instructions uni-directionally to the CPU and RAM is used typically to transfer data and instructions in a bi-directional manner. Both of these or other types of memories may include any suitable form of the computer-readable media described below. A fixed disk 626 is also coupled bi-directionally to CPU 622; it provides additional data storage capacity and may also include any of the computer-readable media described below. Fixed disk 626 may be used to store programs, data, and the like and is typically a secondary storage medium (such as a hard disk) that is slower than primary storage. It will be appreciated that the information retained within fixed disk 626 may, in appropriate cases, be incorporated in standard fashion as virtual memory in memory 624. Removable disk 614 may take the form of any of the computer-readable media described below.

CPU 622 is also coupled to a variety of input/output devices, such as display 604, keyboard 610, mouse 612, and speakers 630, and feedback and forward system for control of the process. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 622 optionally may be coupled to another computer or telecommunications network using network interface 640. With such a network interface, it is contemplated that the CPU might receive information from the network, or might output information to the network in the course of performing the above-described method steps. Furthermore, method embodiments of the present invention may execute solely upon CPU 622 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Example Layout

Figure 13:
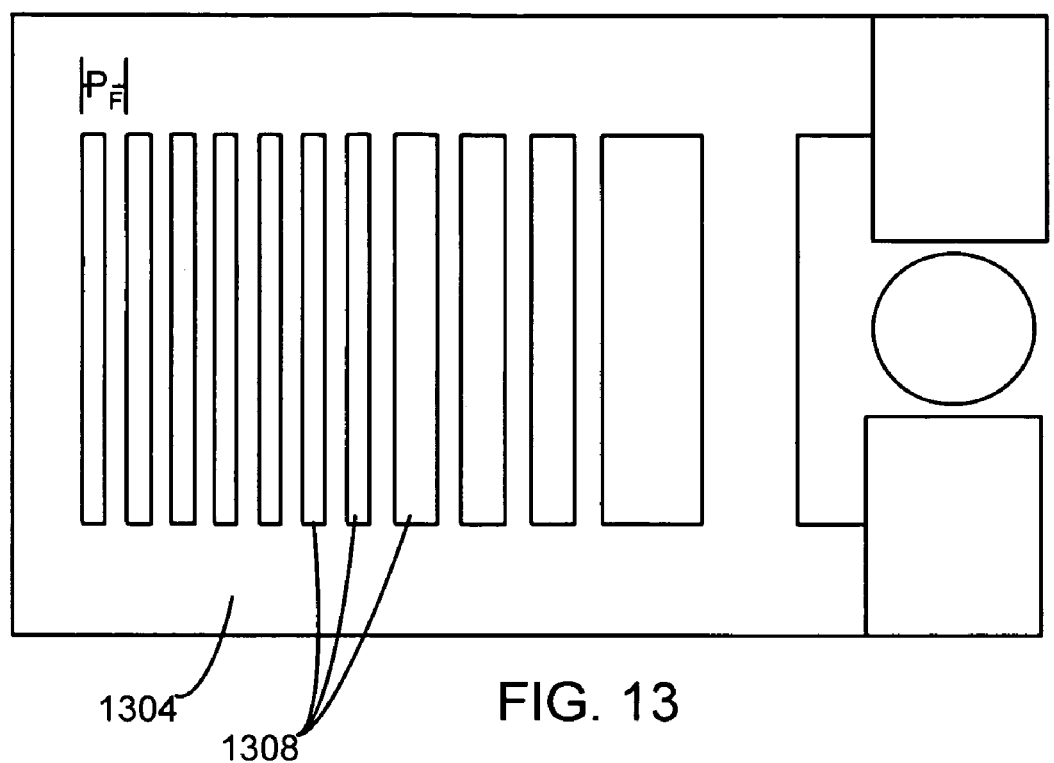
FIG. 13 is a top view of a feature layout.

In a specific example of the use of the process of FIG. 11 in a system, such as shown in FIG. 12, a feature layout is first provided at 1204 (step 1104). FIG. 13 is a top view of a feature layout, which shows a feature pattern 1304 with features 1308 that are to be etched into a wafer. A feature layout pitch $P_F$ is the smallest pitch between features of the feature layout, as shown. The feature layout is provided to the reticle layout processor 1208, which generates at least two (a plurality of) reticle layouts from the feature layout (step 1108).

Figure 14A:
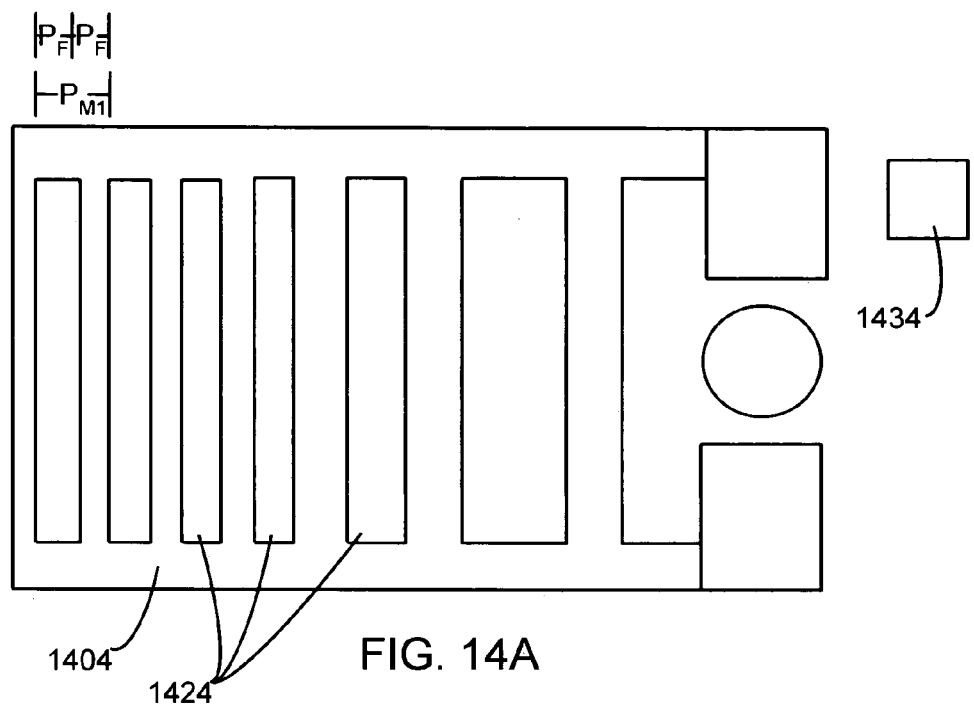
FIGS. 14A-B are top views of patterned layers defined by reticle layouts that are generated using a reticle layout process.
Figure 14B:
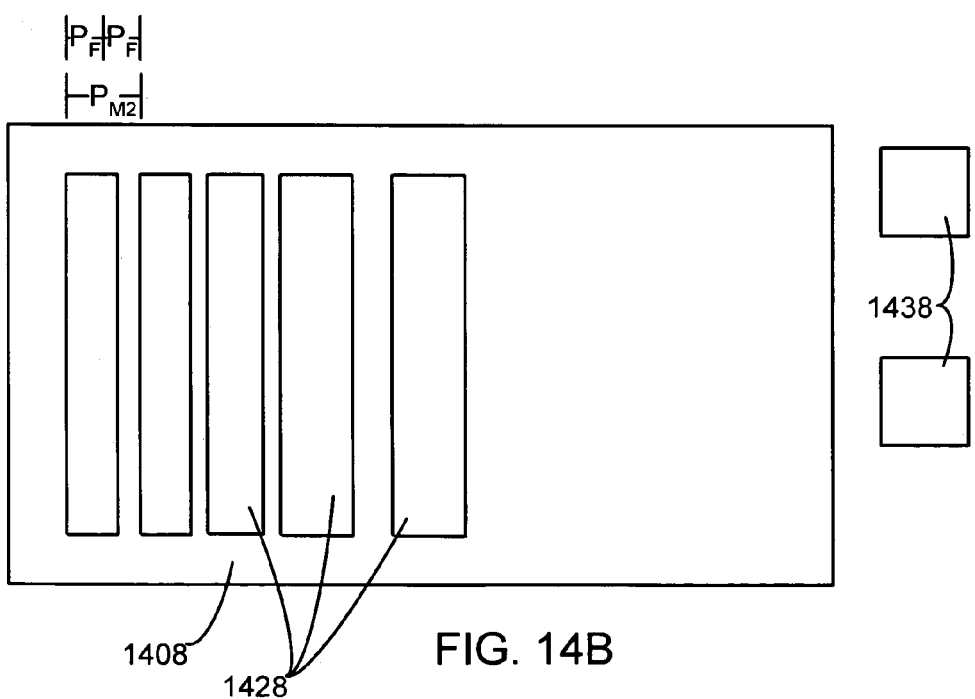

The following is schematically shown for illustrating the working of an embodiment of the invention. FIGS. 14A and 14B are top views of patterned layers defined by a first reticle layout 1404 and a second reticle layout 1408 that are generated using the reticle layout process (step 1108). It should be noted that a patterned layer defined by the first reticle layout 1404 has fewer features 1424 than the features of the feature pattern 1304 and larger features 1424 than the features of the feature pattern and smaller pattern lines between the features 1424. Likewise, the patterned layer defined by the second reticle layout 1408 has fewer features 1428 than the features of the feature pattern 1304 and larger features 1428 than the features of the feature pattern. In addition, the patterned layer defined by the first reticle layout 1404 has one alignment pattern 1434, and the patterned layer defined by the second reticle layout 1408 has two alignment patterns 1438. One alignment pattern of the patterned layer defined by the patterned layer defined by the second reticle layout 1408 matches the alignment pattern 1434 on the patterned layer defined by the first reticle layout 1404 and the other alignment pattern of the patterned layer defined by the second reticle layout 1404 does not match any alignment pattern on the patterned layer defined by the first reticle layout 1404. The patterned layer defined by the first reticle layout has a first reticle layout pitch $P_{M1}$, which is the smallest pitch between features of the patterned layer defined by the first reticle layout, as shown in FIG. 14A. The patterned layer defined by the second reticle layout has a second reticle layout pitch $P_{M2}$, which is the smallest pitch between features of the patterned layer defined by the second reticle layout, as shown in FIG. 14A. As shown in FIG. 14A and FIG. 14B, the first reticle layout pitch $P_{M1}$ and the second reticle layout pitch $P_{M2}$ are each at least twice the feature layout pitch $P_F$. This allows for a lithography with a limiting minimum pitch to provide a feature layout with a pitch of no more than half the limiting minimum pitch, thus increasing the resolution of the lithography by at least two.

Figure 15A:
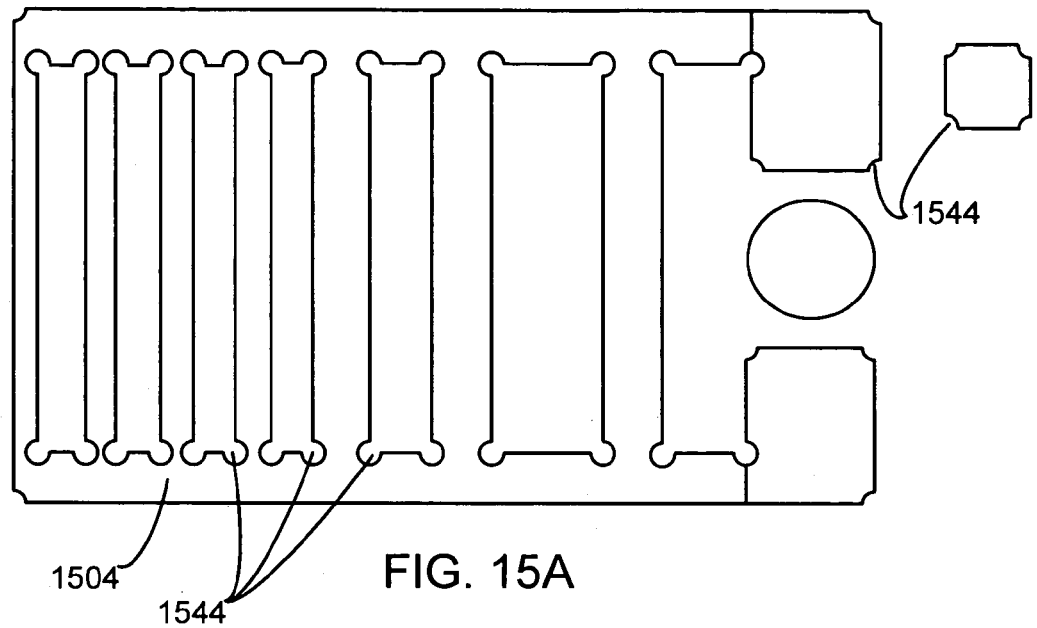
FIGS. 15A-B are top views of patterned layers defined by reticle layouts after a shrink correction is provided.
Figure 15B:
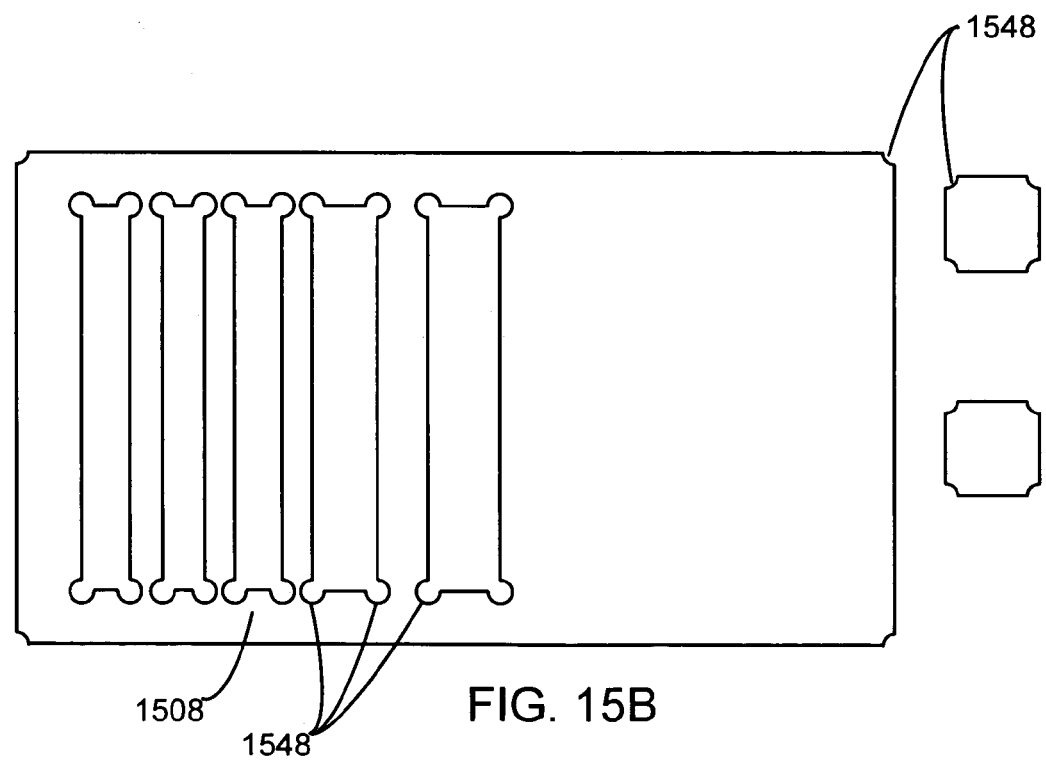

The first reticle layout and the second reticle layout are submitted to a shrink correct processor 1212 to perform shrink correction on the at least two reticle layouts (step 1112). FIG. 15A is a top view of the patterned layer defined by the first reticle layout 1504 after a shrink correction is performed. Corner cutouts 1544 are provided at the corners of the reticle to account for a larger amount of shrinkage at the corners. FIG. 15B is a top view of the patterned layer defined by the second reticle layout 1508 after a shrink correction is performed. Corner cutouts 1548 are provided at the corners of the reticle to account for a larger amount of shrinkage at the corners. The shrink correction rule for providing corner cutouts may be one of many rules provided by the shrink correction processor 1212.

At least two reticles are generated from the at least two reticle layouts with shrink correction (step 1116). Part of this step may be by creating reticle data 1216. A mask layout verification 1220 may be performed on the reticle data. If the mask verification data designates that the reticle data is OK, then reticles are formed from the reticle data.

Figure 16A:
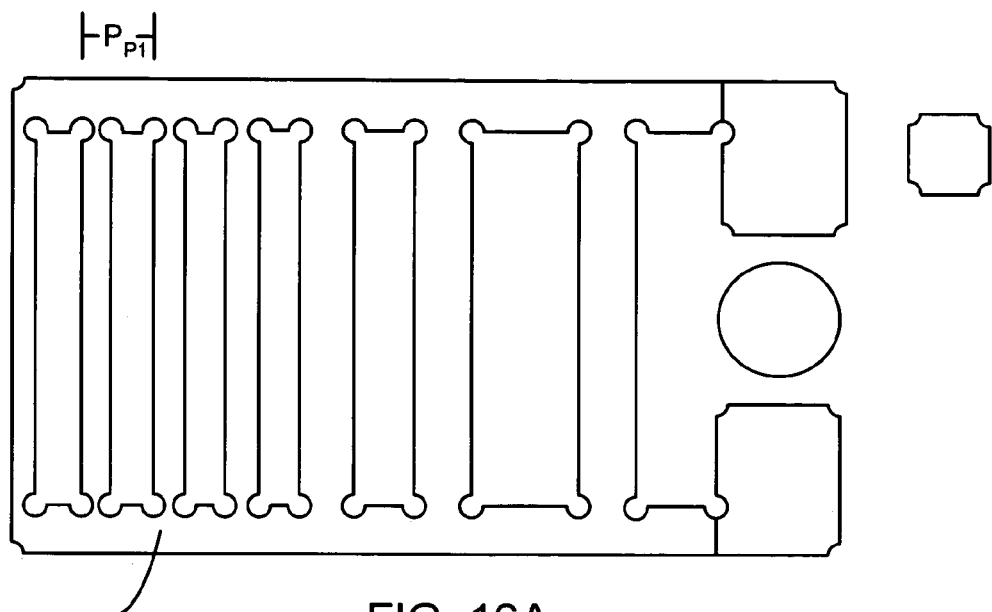
FIG. 16A is a top view of a patterned photoresist layer created from a first reticle layout.
Figure 16B:
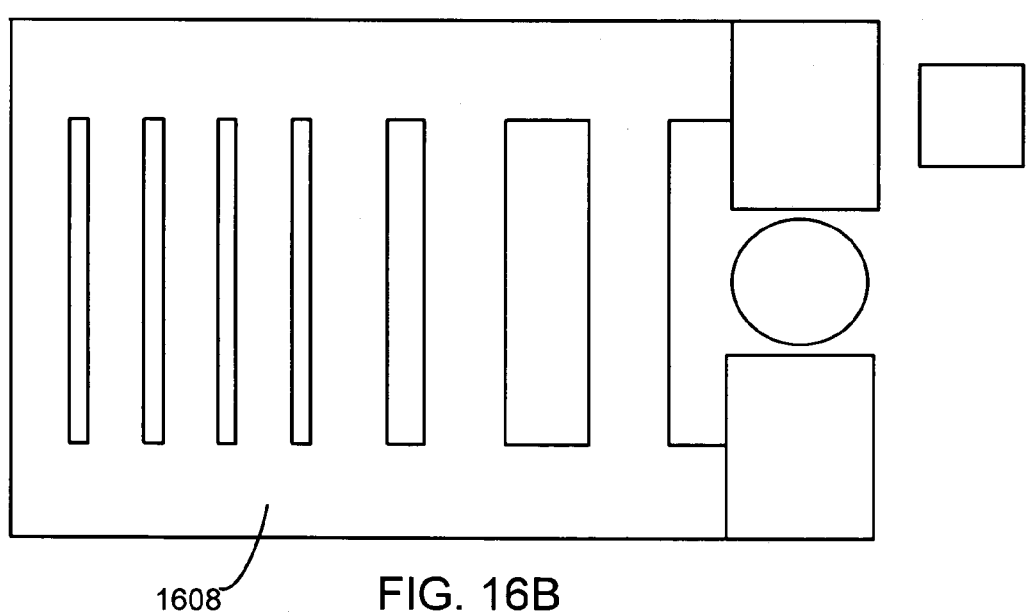
FIG. 16B is a top view of the patterned photoresist layer of FIG. 16A after a sidewall layer is formed.

A first reticle is used to form a first patterned photoresist layer (step 308). FIG. 16A is a top view of a first patterned photoresist layer 1604 created by a reticle from the first reticle layout after shrink correction 1504. The pitch $P_{P1}$ of the first patterned photoresist layer 1604 is the smallest pitch between the features of the first patterned photoresist layer 1604. A sidewall layer is formed over the patterned photoresist layer (step 316). FIG. 16B is a top view of the patterned photoresist layer 1608 after the sidewall layer has been formed to shrink the feature size. The feature size is reduced. The cutouts allow the shrink process to form corners instead of rounding protrusions. A substrate is then etched to etch the features into the substrate (step 316). The patterned photoresist layer is then stripped (step 320).

Figure 17A:
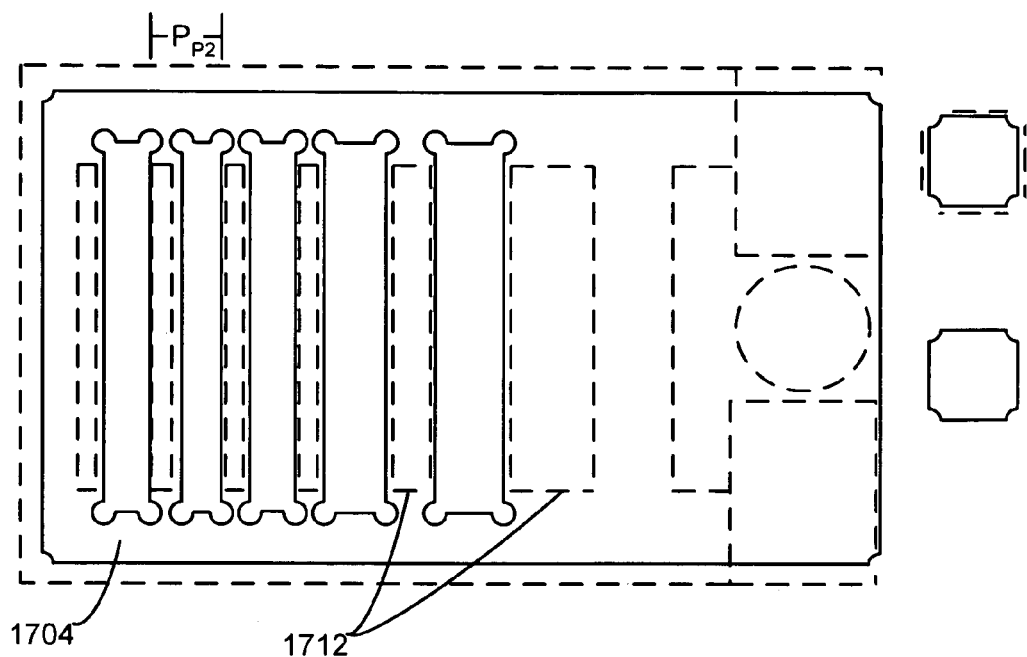
FIG. 17A is a top view of a patterned photoresist layer created from a second reticle layout.
Figure 17B:
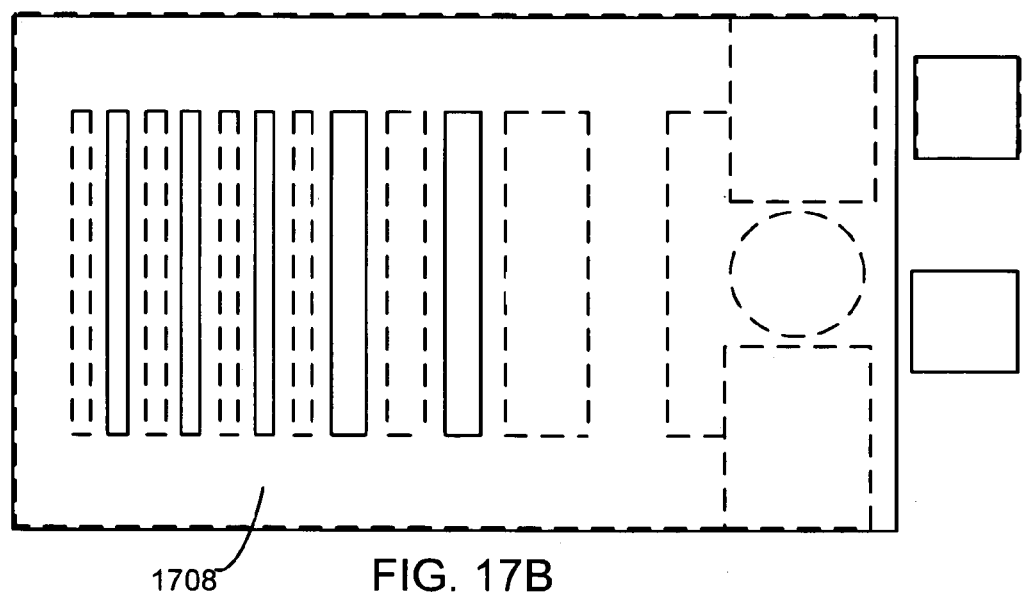
FIG. 17B is a top view of the patterned photoresist layer of FIG. 17A after a sidewall layer is formed.

The process is then repeated using the second reticle (step 324), which is provided from the second reticle layout 1508 after a shrink correction (step 304). The second reticle is used to form a second patterned photoresist layer (step 308) over the previously etched features. FIG. 17A is a top view of the a patterned photoresist layer 1704 formed over the previously etched first set of features 1712 which are shown in dotted lines. The pitch $P_{P2}$ of the second patterned photoresist layer 1704 is the smallest pitch between the features of the second patterned photoresist layer 1704. A sidewall layer is formed over the patterned photoresist layer (step 316). FIG. 17B is a top view of the patterned photoresist layer 1708 after the sidewall layer has been formed to shrink the feature size. The feature sized is reduced. The cutouts allow the shrink process to form corners instead of rounding protrusions. The substrate is then etched to etch the features into the substrate (step 316). The patterned photoresist layer is then stripped (step 320).

Figure 18:
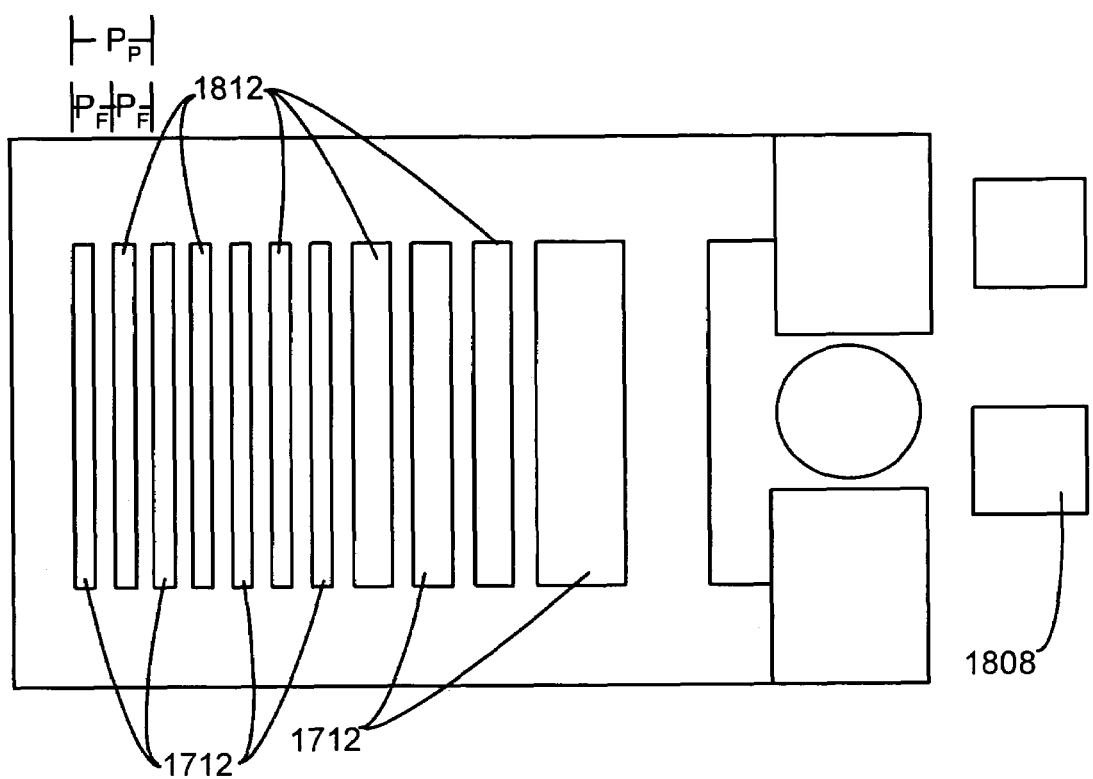
FIG. 18 is a top view of a substrate after a second set of features has been etched.

FIG. 18 is a top view of the substrate after the second set of features has been etched. In the substrate are a first set of features 1712 etched using the first patterned photoresist layer from the first reticle and a second set of features 1812 etched using the second patterned photoresist layer from the second set of reticles. Some of the first set of features 1712 are adjacent to some of the second set of features 1812 to provide the increased pitch and resolution. The pitch $P_F$ of the features is the smallest pitch between the features. As shown the pitch $P_F$ of the substrate after the second set of features has been etched is no more than half the pitch $P_P$ of the first patterned photoresist layer and the second patterned photoresist layer.

The relationship between the first and second patterned photoresist layers is different than the relationship between a trench and via patterned photoresist layers in a dual damascene process, where the trench features are not adjacent to the via features to increase pitch but are located on the via features to create the dual damascene configuration. In addition, the first set of features and the second set of features are etched to about the same depth, wherein trenches are not etched to about the same depth as vias. However, the inventive process may use the first and second patterned photoresist layers to create vias with increased pitch or the first and second patterned photoresist layers may be used to create trenches with increased pitch. The features in this example have about twice the pitch as the pitch resolution of the lithographic process. A second alignment feature 1808 allows improved alignment for the next level of processing.

In a testing and/or development process, the substrate after the first etch or after the second etch may be subjected to a measurement of the line width 1238 and the data may be fed to an empirical model fitting 1260 and/or a parameter extraction engine 1240. The empirical model fitting 126 provides an empirical model that may provide additional rules to the shrink correct processor 1212 to improve the shrink correct process. The parameter extraction 1240 provides a physical model, which is used for the mask layout verification 1220. Such processes improve the shrink correct process.

In an alternative embodiment, the generation of the reticle layouts may form features that are the same size as the features of the feature pattern and then shrink correction rules may be used to increase the size of the features and decrease the dimensions of the patterned lines. In another embodiment, the reticle layout 1208 and shrink correct 1212 may be performed in a single step which both generates multiple reticle layouts and performs shrink correction in a single step, but still may be illustrated as two steps for clarity.

Some of the differences in shrink correction and OPC are as follows: OPC is performed on a reticle so that the resulting patterned photoresist layer is shaped like the desired features. Shrink correction is done on the reticle so that the resulting patterned photoresist layer is not like the desired features, but instead shrink correction makes the resulting patterned photoresist layer more different from the resulting features. A subsequent forming of sidewall layers makes the patterned photoresist layer shaped like the desired features. OPC is performed to provide a higher resolution patterned photoresist layer. Shrink correction is performed to make a lower resolution patterned photoresist layer yield high resolution results on the wafer. OPC provides rules to add photoresist material to compensate for the loss of additional material in forming the patterned photoresist layer. Shrink correction provides rules that remove additional material to compensate for the addition of material during the forming of sidewall layers.

In various embodiments, the etched features may be measured to provide shrink control information or the patterned photoresist layer features after the formation of the sidewall layers may be measured to provide shrink control information. These measurements may be compared to the feature layout or the reticle layouts.

Some processes used a first reticle to provide dense features and a second reticle to provide features that are more isolated. The requirement for such reticles is because dense features required different exposure or photoresist than isolated features. Instead, the use of shrink correction and the formation of a plurality of reticles may be used to form some dense features on one reticle and both dense features and isolated features on another reticle, while, using the same lithography tool and photoresist.

Other embodiments of the inventions may use more than two reticles. For example, three reticles may be used so that the feature layout has a pitch that is one third of the pitch of each reticle. In another example, four reticles may be used so that the feature layout has a pitch that is one fourth of the pitch of each reticle. Such multimask processes are described in U.S. patent application Ser. No. 11/050,985 filed Feb. 3, 2005, by Jeffrey Marks and Reza Sadjadi entitled "Reduction of Feature Critical Dimensions Using Multiple Masks," which is incorporated by reference for all purposes.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method, comprising:
    receiving a feature layout with a feature layout pitch; and
    generating a plurality of reticle layouts from the feature layout wherein each reticle layout of the plurality of reticle layouts has a reticle layout pitch and wherein each reticle layout pitch is at least twice the feature layout pitch, wherein a first reticle layout of the plurality of reticle layouts comprises a first alignment mark and wherein a second reticle layout of the plurality of reticle layouts comprises a first alignment mark to match the first alignment mark of the first reticle layout and a second alignment mark which is not matched by the first reticle layout.

2. The method, as recited in claim 1, further comprising performing a shrink control on each of the plurality of reticle layouts.

3. The method, as recited in claim 2, further comprising generating a plurality of reticles from the plurality of reticle layouts after shrink control is performed.

4. The method, as recited in claim 3, further comprising:
    using a first reticle of the plurality of reticles to form a first patterned layer over a substrate;
    forming a sidewall layer over the first patterned layer;

etching a first set of features into the substrate through the first patterned layer and sidewall layer;

using a second reticle of the plurality of reticles to form a second patterned layer over the substrate with the first set of etched features;

forming a sidewall layer over the second patterned layer; and etching a second set of features into the substrate through the second patterned layer and sidewall layer.

5. The method, as recited in 4, wherein the first set of features are etched to a same depth as the second set of features.

6. The method, as recited in claim 5, wherein the first alignment mark of the first reticle layout is used to form a first alignment mark in the first reticle and the first alignment mark and the second alignment mark of the second reticle layout is used to form a first alignment mark and a second alignment mark in the second reticle.

7. The method, as recited in claim 6, wherein the forming a sidewall layer reduces a CD of the first patterned layer by at least 50%.

8. The method, as recited in claim 7, wherein the forming a sidewall layer reduces a CD of the second patterned by at least 50%.

9. The method, as recited in claim 1, further comprising performing a shrink control on each of the plurality of reticle layouts.

10. The method, as recited in claim 1, further comprising generating a plurality of reticles from the plurality of reticle layouts.

11. The method, as recited in claim 10, further comprising:

using a first reticle of the plurality of reticles to form a first patterned layer over a substrate;

forming a sidewall layer over the first patterned layer;

etching a first set of features into the substrate through the first patterned layer and sidewall layer;

using a second reticle of the plurality of reticles to form a second patterned layer over the substrate with the first set of etched features;

forming a sidewall layer over the second patterned layer; and etching a second set of features into the substrate through the second patterned layer and sidewall layer.

12. The method, as recited in claim 11, wherein the forming a sidewall layer reduces a CD of the first patterned layer by at least 50% and wherein the forming a sidewall layer reduces a CD of the second patterned layer by at least 50%.

13. The method, as recited in 11, wherein the first set of features are etched to a same depth as the second set of features and wherein the performing the shrink correction provides for eliminating different requirements for the isolated and dense features.

14. A semiconductor formed by the method as recited in claim 1.

15. The method, as recited in claim 1, wherein a first reticle layout of the plurality of reticle layouts comprises a first alignment mark and wherein a second reticle layout of the plurality of reticle layouts comprises a first alignment mark to match the first alignment mark of the first reticle layout and a second alignment mark which is not matched by the first reticle layout, so that the first mark of the second reticle layout will be aligned to the first mark of the first reticle layout, and where the second alignment mark of the second reticle layout is for alignment to another layer.

16. An apparatus comprising computer readable media comprising:

computer readable code for receiving a feature layout with a feature layout pitch; and computer readable code for generating a plurality of reticle layouts from the feature layout, wherein each reticle layout of the plurality of reticle layouts has a reticle layout pitch and wherein each reticle layout pitch is at least twice the feature layout pitch, wherein a first reticle layout of the plurality of reticle layouts comprises a first alignment mark and wherein a second reticle layout of the plurality of reticle layouts comprises a first alignment mark to match the first alignment mark of the first reticle layout and a second alignment mark which is not matched by the first reticle layout.

17. The apparatus, as recited in claim 16, further comprising computer readable code for performing a shrink control on each of the plurality of reticle layouts.

* * * * *